US009075935B2

(12) United States Patent
Vasudevan et al.

(10) Patent No.: US 9,075,935 B2
(45) Date of Patent: Jul. 7, 2015

(54) MERIT-BASED CHARACTERIZATION OF ASSERTIONS IN HARDWARE DESIGN VERIFICATION

(71) Applicant: The Board of Trustees of the University of Illinois, Urbana, IL (US)

(72) Inventors: Shobha Vasudevan, Champaign, IL (US); Samuel Hertz, Skokie, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 14/031,949

(22) Filed: Sep. 19, 2013

(65) Prior Publication Data

US 2015/0082263 A1    Mar. 19, 2015

(51) Int. Cl.
G06F 9/455    (2006.01)
G06F 17/50    (2006.01)
(52) U.S. Cl.
CPC ...................................... G06F 17/50 (2013.01)
(58) Field of Classification Search
CPC . G06F 17/5022; G06F 17/504; G06F 11/261;
    G06F 11/3672; G06F 17/505; G06F 2217/10;
    G06F 2217/14; G06F 17/50; G01R 31/2848
See application file for complete search history.

(56) References Cited

PUBLICATIONS

"ActiveProp™ Assertion-based Verification System," Jasper Design Autom . . . , http://www.jasper-da.com/products/activeprop-assertion-based-verification-system, retrieved Oct. 7, 2013 (2 pages).

"IEEE P1850™/D8: Draft Standard for PSL Property Specification Language," published by IEEE, 138 pages (Jun. 2005).
"IEEE Standard for System Verilog—Unified Hardware Design, Specification, and Verification Language," *IEEE Std 1800™-2005*, 664 pages (Nov. 22, 2005).
"IEEE Standard for SystemVerilog—Unified Hardware Design, Specification, and Verification Language," published by *IEEE*, 1315 pages (Feb. 21, 2013).
"IEEE Standard for Verilog © Hardware Description Language," published by *IEEE*, 590 pages (Apr. 7, 2006).
"IEEE Standard Hardware Description: Language Based on the Verilog® Hardware Description Language," *IEEE Std 1364-1995*, published by The Institute of Electrical and Electronics Engineers, Inc., 675 pages (1996).
"IEEE Standard System C® Language Reference Manual," *IEEE Std 1666™-2005*, published by IEEE, 441 pages (Mar. 31, 2006).
"IEEE Standard VHDL: Language Reference Manual," *IEEE Std 1076-1987*, published by the Institute of Electrical and Electronics Engineers, Inc., 218 pages (1988).

(Continued)

*Primary Examiner* — Nha Nguyen
(74) *Attorney, Agent, or Firm* — Lowenstein Sandler LLP

(57) ABSTRACT

A system is configured to generate assertions for verification of an integrated circuit hardware design expressed at a register transfer level (RTL) for variables of interest, each including an antecedent and a consequent. A relative importance score for the variables is determined by characterizing respective variables by a level of importance with respect to a target variable of the consequent. The relative importance scores may be combined to form a relative importance score of the assertion. A relative complexity score for the variable is determined by characterizing the variable by a level of understandability of the variable with respect to the target variable. The relative complexity scores are combined to form a relative complexity score of the assertion. The relative importance and complexity scores are combined to generate a rank score, which is used in ranking the assertion with respect to the RTL design for which the assertion was generated.

19 Claims, 32 Drawing Sheets

(56) References Cited

PUBLICATIONS

"NextOp Announces BugScope Assertion Synthesis for Progressive, Targeted Verification," SpyGlass by Atrenta : Industry News and Atrenta News, http://www.atrenta.com/atrenta-news/141.new, 2 pages (May 6, 2010).

Agrawal, R., et al., "Mining Association Rules between Sets of Items in Large Databases," *Proceeding SIGMOD '93 Proceedings of the 1993 ACM SIGMOD International Conference on Management of Data*, pp. 207-216 (May 1993).

Ammons, G., et al., "Mining Specifications," Proceeding POPL '02 Proceedings of the 29th ACM SIGPLAN-SIGACT Symposium on Principles of Programming Languages, pp. 4-16 (Jan. 16-18, 2002).

Atramentov, A., et al., "A Multi-relational Decision Tree Learning Algorithm—Implementation and Experiments," *Inductive Logic Programming Lecture Notes in Computer Science* vol. 2835, pp. 38-56 (2003).

Bayazit, A., et al., "Complementary Use of Runtime Validation and Model Checking," *ICCAD '05 Proceedings of the 2005 IEEE/ACM International Conference on Computer-aided design*, pp. 1052-1059 (2005).

Bensalem, S., et al., "Powerful Techniques for the Automatic Generation of Invariants," *Computer Aided Verification Lecture Notes in Computer Science*, vol. 1102, pp. 323-335 (1996).

Beyer, D., et al., "Generating Tests from Counterexamples," *Proceedings of the 26th International Conference on Software Engineering (ICSE'04)*, pp. 326-335 (2004).

Biere, Armin, et al., "Verifying Safety Properties of a PowerPC™ Microprocessor Using Symbolic Model Checking without BDDs," *CAV'99*, LNCS 1633, pp. 60-71 (1999).

Bjørner, N., et al., "Automatic Generation of Invariants and Intermediate Assertions," *Principles and Practice of Constraint Programming—CP '95, Lecture Notes in Computer Science*, vol. 976, pp. 589-623 (1995).

Borgelt, C., "An Implementation of the FP-growth Algorithm," *OSDM '05 Proceedings of the 1st international workshop on open source data mining: frequent pattern mining implementations*, pp. 1-5 (2005).

Boulé, M., et al., "Assertion Checkers in Verification, Silicon Debug and In-Field Diagnosis," *Proceedings of the 8th International Symposium on Quality Electronic Design (ISQED'07)*, pp. 613-620 (2007).

Boulé, M., et al., "Automata-Based Assertion-Checker Synthesis of PSL Properties," *ACM Transactions on Design Automation of Electronic Systems*, vol. 13, No. 1, Article 4, pp. 1-21 (Jan. 2008).

Breslow, L., et al., "Simplifying decision trees: A survey," *The Knowledge Engineering Review*, vol. 12, No. 1, pp. 1-40 (Jan. 1997).

Brin, Sergey, et al., "The anatomy of a large-scale hypertextual Web search engine," *Computer Networks and ISDN Systems* 30:107-117 (1998).

Caplain, M., "Finding Invariant Assertions for Proving Programs," *Proceedings of the International Conference on Reliable Software Archive*, pp. 165-171 (1975).

Chang, Po-Hsien, et al., "Automatic assertion extraction via sequential data mining of simulation traces," published by *IEEE*, pp. 607-612 (2010).

Chen, M., et al., "Functional Test Generation Using Efficient Property Clustering and Learning Techniques," *IEEE Transactions on Computer-Aided Design of Integrated Circuits and Systems*, vol. 29, No. 3, pp. 396-404 (Mar. 2010).

Cheng, X., et al., "Simulation-Directed Invariant Mining for Software Verification," *Date '08 Proceedings of the Conference on Design, Automation and Test in Europe*, pp. 682-687 (2008).

Chockler, Hana, et al., "A Practical Approach to Coverage in Model Checking," *CAV 2001*, LNCS 2102, pp. 66-78 (2001).

Clarke, E., et al., "Automatic Verification of Finite-State Concurrent Systems Using Temporal Logic Specifications," *Journal ACM Transactions on Programming Languages and Systems (TOPLAS) TOPLAS Homepage archive*, vol. 8, No. 2, pp. 244-263 (Apr. 1986).

Clarke, E., et al., "Counterexample-Guided Abstraction Refinement for Symbolic Model Checking," *Journal of the ACM*, vol. 50, No. 5, pp. 752-794 (Sep. 2003).

Clarke, Edmund, et al., "Bounded Model Checking Using Satisfiability Solving," *Formal Methods in System Design*, 19:7-34 (2001).

Domingos, P., et al., "Mining High-Speed Data Streams," *KDD '00 Proceedings of the Sixth ACM SIGKDD International Conference on Knowledge Discovery and Data Mining*, pp. 71-80 (2000).

Ernst, M., et al., "Dynamically Discovering Likely Program Invariants to Support Program Evolution," *IEEE Transactions on Software Engineering*, vol. 27, No. 2, pp. 213-224 (Feb. 2001).

Ernst, M., et al., "The Daikon system for dynamic detection of likely invariants," *Science of Computer Programming*, vol. 69, pp. 35-45 (2007).

Fine, S., et al., "Coverage Directed Test Generation for Functional Verification using Bayesian Networks," *Design Automation Conference, 2003, Proceedings*, pp. 286-291 (Jun. 2-6, 2003).

Floyd, R., "Assigning Meanings to Programs," *Mathematical Aspects of Computer Science: Proceedings of Symposia in Applied Mathematics*, vol. 19, pp. 19-32 (1967).

Gabel, Mark, et al., "Javert: Fully Automatic Mining of General Temporal Properties from Dynamic Traces," *SIGSOFT '08/FSE-16 Proceedings of the 16th ACM SIGSOFT International Symposium on Foundations of Software Engineering*, pp. 339-349 (Nov. 9-15, 2008).

Gurumurthy, S., et al., "On Efficient Generation of Instruction Sequences to Test for Delay Defects in a Processor," *GLSVLSI '08 Proceedings of the 18th ACM Great Lakes Symposium on VLSI*, pp. 279-284 (May 4-6, 2008).

Guzey, O., et al., "Functional Test Selection Based on Unsupervised Support Vector Analysis," *DAC '08 Proceedings of the 45th annual Design Automation Conference*, pp. 262-267 (2008).

Hangal, S., et al., "IODINE: A Tool to Automatically Infer Dynamic Invariants for Hardware Designs," *Design Automation Conference, 2005, Proceedings. $42^{nd}$*, pp. 775-778 (Jun. 13-17, 2005).

Haveliwala, Taher H., "Efficient Computation of PageRank," Stanford University, 15 pages (Oct. 18, 1999).

Hegbreitt, B., et al., "Heuristic Methods for Mechanically Deriving Inductive Assertions," *Proc. 3rd Internat. Joint Conf. on Artif. Intel.*, pp. 524-536 (Aug. 1973).

Hekmatpour, A., et al., "Block-based Schema-driven Assertion Generation for Functional Verification," *Proceedings of the 14th Asian Test Symposium (ATS '05)*, pp. 34-39 (2005).

Hoare, C., "An Axiomatic Basis for Computer Progamming," *Communications of the ACM*, vol. 12, No. 10, pp. 576-580, 583 (Oct. 1969).

Hoskote, Yatin, et al., "Coverage Estimation for Symbolic Model Checking," *DAC 99*, New Orleans, Louisiana, 6 pages (1999).

Isaksen, B., et al., "Verification Through the Principle of Least Astonishment," *ICCAD '06 Proceedings of the 2006 IEEE/ACM International Conference on Computer-Aided Design*, pp. 860-867 (2006).

Kamvar, Sepandar D., et al., "Extrapolation Methods for Accelerating PageRank Computations," *WWW2003*, Budapest, Hungary, 10 pages (May 20-24, 2003).

Karp, R., "Reducibility Among Combinatorial Problems," *Complexity of Computer Computations*, Plenum Press, RE Miller and JM Thatcher, eds., pp. 85-103 (1972).

Katz, S., et al., "A Heuristic Approach to Program Verification," *Defense Technical Information Center*, pp. 500-512 (1973).

Katz, Sagi, et al., "'Have I Written Enough Properties?'—A Method of Comparison between Specification and Implementation," *CHARME'99*, LNCS 1703, pp. 280-297 (1999).

Kelm, J., et al. "Rigel: An Architecture and Scalable Programming Interface for a 1000-core Accelerator," *ACM SIGARCH Computer Architecture News 37.3*, pp. 140-151 (2009).

Li, W., et al., "Scalable Specification Mining for Verification and Diagnosis," *Design Automation Conference (DAC), 2010 47th ACM/ IEEE*, pp. 755-760 (2010).

Lisherness, P., "SCEMIT: A SystemC Error and Mutation Injection Tool," *Design Automation Conference (DAC), 2010 47th ACM/IEEE*, pp. 228-233 (2010).

(56) References Cited

OTHER PUBLICATIONS

Liu, L., et al., "Towards Coverage Closure: Using GoldMine Assertions for Generating Design Validation Stimulus," *Design, Automation & Test in Europe Conference & Exhibition (DATE)*, 2011, pp. 1-6 (2011).

Liu, L., et al., "Automatic Generation of Assertions From System Level Design Using Data Mining," 9th IEEE/ACM International Conference on Formal Methods and Models for Codesign, pp. 191-200 (Apr. 2011).

McGarry, K., "A survey of interestingness measures for knowledge discovery," *The Knowledge Engineering Review*, vol. 20, No. 1, pp. 39-61 (2005).

McMillan, K., "Symbolic Model Checking: An approach to the state explosion problem," No. CMU-CS-92-131, Carnegie-Mellon Univ., Pittsburgh, PA, Dept. of Computer Science, 212 pages (May 1992).

Mishra, P., et al. "Functional Coverage Driven Test Generation for Validation of Pipelined Processors," *Design, Automation and Test in Europe, 2005. Proceedings*, pp. 678-683 (2005).

Misra, J., "Prospects and Limitations of Automatic Assertion Generation for Loop Programs," *SIAM J. Comput.*, vol. 6, No. 4, pp. 718-729 (Dec. 1977).

Nimmer, J., et al., "Automatic Generation of Program Specifications," *ACM SIGSOFT Software Engineering Notes*, vol. 27, No. 4, pp. 229-239 (2002).

Nimmer, J., et al., "Invariant Inference for Static Checking," *Proceedings of the 10th ACM SIGSOFT Symposium on Foundations of Software Engineering*, pp. 11-20 (2002).

Page, Larry, et al., "The PageRank citation ranking: Bringing order to the web." Online: http://citeseer. nj. nec. com/page98pagerank. html [Apr. 6, 2003 ](1998).

Păsăreanu, C., et al., "Verification of Java Programs using Symbolic Execution and Invariant Generation," *Model Checking Software, Lecture Notes in Computer Science*, vol. 2989, pp. 164-181 (2004).

Pintér, G., et al., "Automatic generation of executable assertions for runtime checking temporal requirements," *Proceedings of the Ninth IEEE International Symposium on High-Assurance Systems Engineering (HASE '05)*, pp. 111-120 (2005).

Pnueli, A., "The Temporal Logic of Programs," *Foundations of Computer Science, 1977., 18th Annual Symposium on*, pp. 46-57 (1977).

Rogin, F., et al,, "Automatic generation of complex properties for hardware designs," *Design, Automation and Test in Europe, 2008, DATE '08*, pp. 545-548 (2008).

Safyallah, H,, et al., "Dynamic Analysis of Software Systems using Execution Pattern Mining," *Proceedings of the 14th IEEE International Conference on Program Comprehension (ICPC'06)*, pp. 84-88 (2006).

Silberschatz, A., et al., "What Makes Patterns Interesting in Knowledge Discovery Systems," *IEEE Transactions on Knowledge and Data Engineering*, vol. 8, No. 6, pp. 970-974 (Dec. 1996).

Stark, J., et al., "Invariant discovery via failed proof attempts," *Logic-Based Program Synthesis and Transformation*, pp. 271-288 (1999).

Tan, P., et al., "Selecting the right interestingness measure for association patterns," *Proceedings of the Eighth ACM SIGKDD International Conference on Knowledge Discovery and Data Mining*, pp. 32-41 (2002).

Tiwari, A., et al., "A Technique for Invariant Generation," *Tools and Algorithms for the Construction and Analysis of Systems*, pp. 113-127 (2001).

Vasudevan, S., "Automatic Generation of High Quality Assertions," *Electrical and Computer Engineering at Carnegie Mellon University*, http://www.ece.Cmu.edu/news/calendar/2013/05/vasudevan.html, 1 page (May 2, 2013).

Vasudevan, S., et al., "Goldmine: Automatic Assertion Generation Using Data Mining and Static Analysis," *Design, Automation & Test in Europe Conference & Exhibition (DATE)*, 2010, pp. 626-629 (2010).

Wang, D., et al., "Automatic Assume Guarantee Analysis for Assertion-Based Formal Verification," *Proceedings of the 2005 Asia and South Pacific Design Automation Conference*, pp. 561-566 (2005).

Wang, Li-C., et al,, "Automatic Generation of Assertions for Formal Verification of Power PC™ Microprocessor Arrays Using Symbolic Trajectory Evaluation," *Proceedings of the 35th Annual Design Automation Conference*, pp. 534-537 (1998).

Wen, Ch-P., et al., "Simulation-based functional test justification using a Boolean data miner," *International Conference on Computer Design, 2006. ICCD 2006*, pp. 300-307 (2007).

Yang, J., et al., "Dynamically Inferring Temporal Properties," *Proceedings of the 5th ACM SIGPLAN-SIGSOFT Workshop on Program Analysis for Software Tools and Engineering*, pp. 23-28 (2004).

Algorithm 1 Relative Variable Importance

1: procedure $relative\_importance(v, k, v_t)$
2:     if $k < k_{max}$ then
3:         $V \leftarrow dependencies(v)$
4:         for all $v_i \in V$ do
5:             $i_r \leftarrow I_g(v_i) + I_r(v, v_t)$
6:             $V_r \leftarrow V_r \cup (v_i^{-k}, i_r)$
7:             $E_r \leftarrow E_r \cup (v_i^{-k}, v)$
8:         end for
9:         for all $v_i \in V$ do
10:            if $temporal(v_i)$ then
11:                 $relative\_importance(v_i^{-k}, k+1, v_t)$
12:            else
13:                 $relative\_importance(v_i^{-k}, k, v_t)$
14:            end if
15:         end for
16:     end if
17: end procedure

*FIG. 3*

Algorithm 2 Relative Variable Complexity

```
 1: procedure relative_complexity(v, k, vₜ)
 2:     if k < k_max then
 3:         X ← expressions(v)
 4:         V ← dependencies(v)
 5:         for all vᵢ ∈ V do
 6:             S ← sensitivities(vᵢ)
 7:             c_r ← 0
 8:             for all Xᵢ ∈ X ∩ S do
 9:                 c_r ← c_r + |Xᵢ|
10:             end for
11:             V_r ← V_r ∪ (vᵢ⁻ᵏ, c_r)
12:             E_r ← E_r ∪ (vᵢ⁻ᵏ, v)
13:         end for
14:         for all vᵢ ∈ V do
15:             if temporal(vᵢ) then
16:                 relative_complexity(vᵢ⁻ᵏ, k + 1, vᵢ)
17:             else
18:                 relative_complexity(vᵢ⁻ᵏ, k, vₜ)
19:             end if
20:         end for
21:     end if
22: end procedure
```

*FIG. 4*

```
1  module arb2(clk, rst, req1, req2, gnt1, gnt2);
2
3  input clk, rst;
4  input req1, req2;
5  output gnt1, gnt2;
6
7  reg gnt_;
8  reg gnt1, gnt2;
9
10 always @ (posedge clk, posedge rst)
11     if (rst)
12         gnt_ <= 0;
13     else
14         gnt_ <= gnt1;
15
16 always @ (*)
17     if (gnt_)
18     begin
19         gnt1 = req1 & ~req2;
20         gnt2 = req2;
21     end
22     else
23     begin
24         gnt1 = req1;
25         gnt2 = req2 & ~req1;
26     end
27
28 endmodule
```

```
1  module pci_master32_sm(input clk_in, reset_in, pci_gnt_in, pci_frame_in,
2                         pci_frame_out_in, pci_irdy_in, pci_trdy_in,
3                         pci_stop_in, req_in, rdy_in,
4                         output pci_frame_out, pci_frame_en_out);
5  reg sm_idle;
6  reg sm_address;
7  reg sm_data_phases;
8  reg sm_turn_around;
9
10 wire u_dont_have_pci_bus = pci_gnt_in || ~pci_frame_in || ~pci_irdy_in;
11 wire u_have_pci_bus = ~pci_gnt_in && pci_frame_in && pci_irdy_in;
12
13 wire frame_en_slow = (sm_idle && u_have_pci_bus && req_in && rdy_in) ||
14                      sm_address || (sm_data_phases && ~pci_frame_out_in && ~abort1 && ~abort2;
15 wire frame_en_keep = sm_data_phases && pci_frame_out_in && ~abort1 && ~abort2;
16 assign pci_frame_en_out = frame_en_slow ||
17                           frame_en_keep && pci_stop_in && pci_trdy_in;
```

FIG. 8B

```
18  reg [3:0] cur_state;
19  reg [3:0] next_state;
20
21  parameter S_IDLE = 4'h1 ;
22  parameter S_ADDRESS = 4'h2 ;
23  parameter S_TRANSFER = 4'h4 ;
24  parameter S_TA_END = 4'h8 ;
25
26  wire ch_state_slow = sm_address || sm_turn_around ||
27                      sm_data_phases && (pci_frame_out_in && mabort1 ||| mabort2);
28  wire ch_state_med = ch_state_slow ||
29                     sm_idle && u_have_pci_bus && req_in && rdy_in;
30  wire change_state = ch_state_med ||
31                     sm_data_phases && (~(pci_trdy_in && pci_stop_in));
32
33  always @ (posedge reset_in or posedge clk_in)
34  begin
35      if (reset_in)
36          cur_state <= S_IDLE;
37      else if (change_state)
38          cur_state <= next_state;
39  end
40
41  always @ (cur_state or do_write or pci_frame_out_in)
42  begin
43      sm_idle = 1'b0 ;
44      sm_address = 1'b0 ;
45      sm_data_phases = 1'b0 ;
46      sm_turn_around = 1'b0 ;
47
```

```
48
49         case (cur_state)
50             S_IDLE:
51             begin
52                 sm_idle = 1'b1 ;
53                 next_state = S_ADDRESS ;
54             end
55
56             S_ADDRESS:
57             begin
58                 sm_address = 1'b1 ;
59                 next_state = S_TRANSFER ;
60             end
61
62             S_TRANSFER:
63             begin
64                 sm_data_phases = 1'b1 ;
65                 if (pci_frame_out_in)
66                     next_state = S_TA_END ;
67                 else
68                     next_state = S_TRANSFER ;
69             end
70
71             S_TA_END:
72             begin
73                 sm_turn_arround = 1'b1 ;
74                 next_state = S_IDLE ;
75             end
76
77             default:
78                 next_state = S_IDLE ;
79         endcase
80     end
81 endmodule
```

*FIG. 8C*

| Output | Positional Rank | Percentile |
|---|---|---|
| pci_ad_out | 3 | 98.1203 |
| pci_cbe_out | 5 | 96.6165 |
| pci_frame_en_out | 14 | 89.8496 |
| pci_cbe_en_out | 15 | 89.0977 |
| pci_frame_out | 19 | 86.0902 |
| pci_irdy_out | 21 | 84.5865 |
| pci_frame_load_out | 22 | 83.8346 |
| pci_ad_en_out | 23 | 83.0827 |
| ad_load_out | 26 | 80.8271 |
| retry_out | 27 | 80.0752 |
| data_out | 35 | 74.0602 |
| rtransfer_out | 47 | 65.0376 |
| first_out | 52 | 60.5263 |
| wait_out | 56 | 57.5188 |
| pci_irdy_en_out | 58 | 56.015 |
| ad_load_on_transfer_out | 61 | 53.0075 |
| rerror_out | 62 | 52.2556 |
| pci_req_out | 70 | 44.7368 |
| mabort_out | 71 | 43.985 |
| wtransfer_out | 81 | 30.0752 |

*FIG. 9*

| Target | Minimum Ideality | Median Ideality | Maximum Ideality |
|---|---|---|---|
| pci_irdy_out | 0.809296 | 0.809407 | 0.809519 |
| wtransfer_out | 1 | 1 | 1 |
| pci_ad_en_out | 0.00137253 | 0.394661 | 0.792062 |
| pci_frame_load_out | 1 | 1 | 1 |
| pci_cbe_en_out | 0.0296962 | 0.373479 | 0.67663 |
| pci_irdy_en_out | 1 | 1 | 1 |
| pci_frame_out | 0.408212 | 0.424985 | 1 |
| wait_out | 1 | 1 | 1 |
| first_out | 0.888156 | 1 | 1 |
| rerror_out | 1 | 1 | 1 |
| pci_frame_en_out | 0.0297634 | 0.36018 | 0.618062 |
| retry_out | 0.117951 | 0.117951 | 0.117951 |
| ad_load_on_transfer_out | 0.072491 | 0.503257 | 1 |
| ad_load_out | 0.0530941 | 0.0579914 | 0.7411 |
| pci_req_out | 0.0684741 | 0.377218 | 0.844746 |
| rtransfer_out | 1 | 1 | 1 |

*FIG. 15*

MERIT-BASED CHARACTERIZATION OF ASSERTIONS IN HARDWARE DESIGN VERIFICATION

FEDERALLY SPONSORED RESEARCH

This invention was made with Government support under government contract number CCF0953767 awarded by the National Science Foundation. The United States Government has certain rights in the invention.

TECHNICAL FIELD

The present disclosure relates to verification of integrated circuit hardware design expressed at the register transfer level (RTL), and more particularly, to the computer valuation of assertions that apply relative values to assertions, ranked by ability to most completely verify the RTL design.

BACKGROUND

In the hardware design industry, having a design error can be disastrous. In the Intel Pentium P5 chip, a floating-point division bug caused Intel to lose up to $475 million in 1995. More recently in 2007, AMD encountered a virtualization bug in its Phenom line of CPUs requiring them to revise the silicon, a costly procedure. Unlike software bugs, hardware bugs cannot always be fixed with a simple patch. These bugs cost hardware manufacturers millions of dollars and precious time in a quickly moving industry.

Assertions or invariants provide a mechanism to express desirable properties that should be true in the system. Assertions are used for validating hardware designs at different stages through their life cycles, such as pre-silicon formal verification, dynamic validation, runtime monitoring and emulation. Assertions are also synthesized into hardware for post-silicon debug and validation and in-field diagnosis.

Among all the solutions for ensuring robustness of hardware systems, assertion based verification has emerged as the most popular candidate solution for "pre-silicon" design functionality checking. Assertions are used for static (formal) verification as well as dynamic verification of the register transfer level (RTL) design in the pre-silicon phase. Because not all assertions are as helpful when compared to others, a ranking of assertions may help to decide which assertions are more important and should be employed over others.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 3 is Algorithm 1, relative variable importance with regards to a variable in an assertion to an overall design.

FIG. 4 is Algorithm 2, which shows assertion complexity as a function of assertion importance.

FIG. 5 is Verilog source code for an example 2-port arbiter.

FIGS. 8A, 8B and 8C comprise an implementation in Verilog RTL for a PCI (Peripheral Component Interconnected) master state machine.

FIG. 9 is the positional rank and positional rank percentile of each output based upon the output's global importance score.

FIG. 15 is a data sheet showing an ideality score of the lowest, middle and highest ranked true assertions for each target variable.

DETAILED DESCRIPTION

Figure 1:
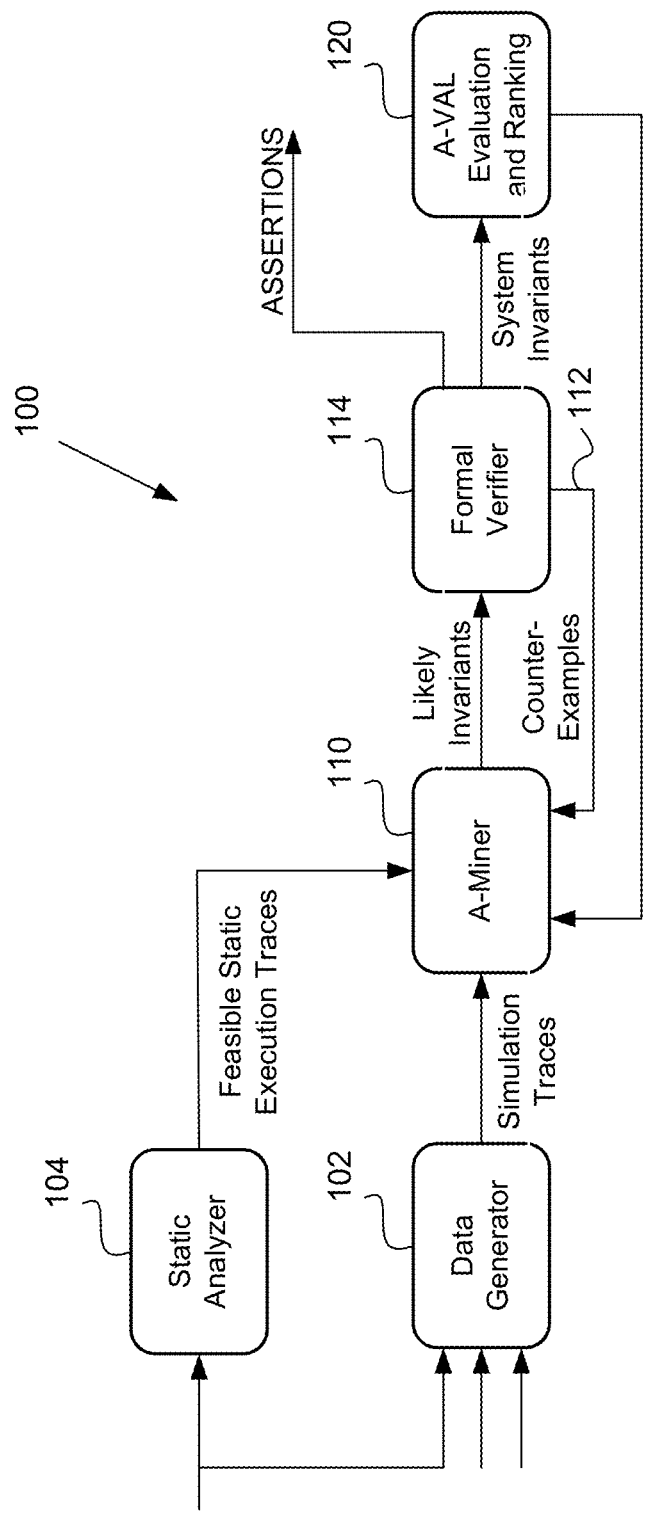
FIG. 1 is a system diagram displaying the processing levels of the disclosed system used to generate assertions using data mining and static analysis.
Figure 2:
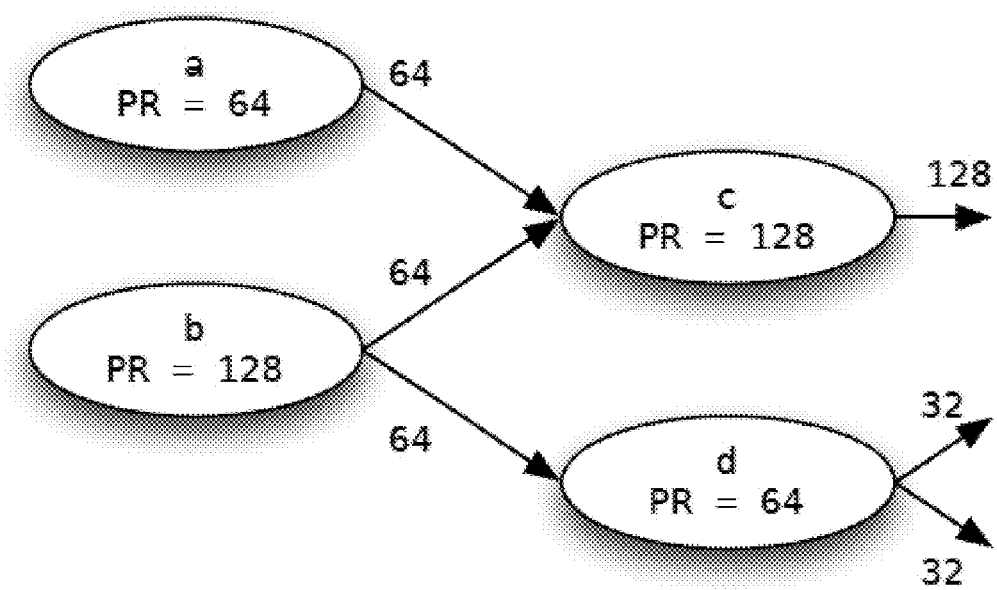
FIG. 2 is an example of functioning of Google's PageRank.

The present disclosure relates to verification of integrated circuit hardware design expressed at the register transfer level (RTL), and more particularly, to the computer generation of assertions with which to verify the RTL design. Disclosed is an assertion ranking methodology that considers at least two parameters: assertion importance and complexity. In short, assertion importance and complexity estimate the importance and understandability of the behavior conveyed by an assertion respectively. The assertion importance and complexity may be used to rank an assertion as to its value in use to verify an RTL design.

In a further step of the methodology, an advanced rank aggregation algorithm may aggregate ranking results from various sources to generate an optimal ranking. The rank aggregation algorithm may be capable of an arbitrary number of rankings for metrics such as importance, complexity, coverage and expectedness as will be further explained.

To compute assertion importance, the disclosed system computes a global importance score for each variable in an RTL design by executing Algorithm A (FIG. 3). PageRank is a seminal graph-ranking algorithm used by Google to rank web search results. PageRank represents the World Wide Web using a graph, where each node denotes a web page and each directed edge denotes a hyperlink from one page to another. PageRank analyzes the hyperlink structure of the World Wide Web graph to compute an importance score for each web page. PageRank will rank graph nodes with many incoming and outgoing edges higher than those with fewer such edges. The PageRank algorithm may be adapted to work for an RTL variable dependency graph instead of the web graph as will be further explained.

The relationship between the variables in an assertion's antecedent and those in its consequent is relevant. Because the global importance score is a query-independent ranking algorithm, it does not consider such relationships. The system therefore may compute a relative importance score that captures how important a variable is with respect to a target variable. Relative importance scores consider the spatial distance, temporal distance and importance of execution paths between references to the given variable and assignments to the target variable. The system uses relative importance scores of variables of an assertion to compute an overall importance score for the assertion.

An assertion with a high importance score will likely have low understandability. Consequently, the system balances assertion importance with assertion complexity. To compute assertion complexity, the system first computes a relative complexity score that captures the understandability of the dependencies between a variable and a target variable. The relative complexity score captures how understandable a variable is with respect to a target variable. Relative complexity scores consider the spatial distance, temporal distance and understandability of execution paths between references to the given variable and assignments to the target variable. The system uses relative complexity scores of variables of an assertion to compute an overall complexity score for the assertion.

The system uses assertion importance and complexity scores to compute assertion rank. An assertion's rank score estimates its value with respect to the design for which it was written. As the name implies, assertion rank scores also provide a means to rank a set of assertions. The system may normalize an assertion's rank score with respect to a maximum rank score. The system refers to an assertion's normalized rank score as its ideality score. An assertion's ideality score estimates how close or far an assertion is from the ideal assertion as will be discussed in more detail.

The inventors show a detailed case study using an open source RTL implementation of the PCI protocol. The case study demonstrates that the proposed assertion quality metrics agree with human judgment. Presented is an analysis of the choices made by the ranking methodology for assertions generated using GoldMine. In addition to the case study, the inventors present experimental results that further verify the effectiveness of the methodology.

Hardware Development Cycle

To understand why verification is important and what methods are used for testing circuits, it is helpful to understand the hardware development cycle. The first step in the hardware development cycle is the specification stage, where architects will specify the behavior of a circuit. This may include creating system-level models to simulate this behavior using tools like SystemC. The next step is to specify the Register Transfer Level (RTL) implementation using a hardware design language (HDL) such as Verilog or VHDL that describe the flow of data in a circuit and how that data is manipulated to achieve the desired behavior. The RTL implementation is then synthesized into a gate-level implementation, which specifies how the circuit must be constructed out of individual logic gates. This gate-level implementation is then mapped out to determine where the transistors and wiring will be physically located on a chip. This physical layout is then manufactured at a fabrication plant where the circuits are printed onto silicon. This silicon is placed into a package, which can interface with other systems.

Since there is so much work and cost that goes into each step of this cycle, hardware designers put an extremely large effort into making sure that each step is done correctly. Making a mistake in one of the steps means that all of the following steps will be wrong, costing even more time and money. The present disclosure focuses on the verification of the RTL design. There are two main strategies used in the verification of the RTL design: one is based on formal mathematical reasoning, and is called formal verification, the other is based on generating input stimuli and observing the response of the system, and is called simulation based verification. The simulation based verification strategy is known as a directed test, which involves biasing the inputs in a certain way to create expected behavior. The directed tests are often paired with mechanisms, which check the outputs and internal state to ensure that the expected behavior and the actual behavior match. Another strategy is to randomize the input stimuli to create completely random behavior. This random simulation is paired with many checkers that ensure that circuit behavior is legal for the system. Assertion based verification involves the use of logical statements of intent, or assertions to ascertain if the design is following specified behavior. Assertions are encoded as if-then-else statements that evaluate to true/false values. Assertions can be used with simulation-based verification, to check if the input stimulus applied to the system results in the assertion evaluating to true. Assertions aid in the process of formal verification that checks if the assertion is true for all possible input stimuli.

Assertions

The idea of an assertion was first proposed by Alan Turing, who suggested breaking down a large software routine into a set of properties which could each be checked. Later, Robert Floyd developed a formal system for reasoning about flowcharts which was then refined by C. A. R. Hoare. The system was adapted for use in software verification which allowed a programmer to check that certain conditions did not occur. Hardware design and verification was a largely manual process until Verilog HDL became a standard in 1987. Verilog HDL supports the 'assert' keyword, which allows a designer to specify a condition that must always evaluate to true. Around this same time, formal verification of assertions was also introduced which allowed assertions to be formally proved. However, the power of assertions was limited until hardware verification languages (HVLs) were developed which introduced the concept of assertion-based verification (ABV). Today, there are many different HVLs which enable ABV such as SystemVerilog, OpenVera, and Property Specification Language.

Assertion based verification involves defining desired properties of the hardware design and asserting that those properties are never violated. These assertions can be paired with a dynamic method, such as directed tests or random simulation, and will give an error if the property is violated. In addition, formal verification is a static method that creates a model of the design and checks if the assertion can ever be violated. Formal verification either guarantees that the property can never be violated or gives a counterexample that shows how the assertion is violated. In addition to RTL simulation based verification, assertions can be physically synthesized into silicon and used for checking after the chip has been fabricated. Because of their power and versatility, assertions have become the most popular method of verifying an RTL design.

However, assertion based verification has a significant drawback. Assertion generation has been a manually intensive task until recently, when automatic assertion technologies like NextOp's Bugscope software, GoldMine and others have emerged. The designer or the verification engineer specifies assertions. This can be easy enough for simple combinational properties, but for complex temporal properties, it can be very time consuming. In addition, it is difficult to reason between module boundaries. Even if the assertion is correctly specified, certain constraints must also be specified for the assertion to be true. It can also be difficult coming up with the right number of assertions. If the set of assertions is too small, it will not provide very good coverage of the design, leading to a large number of bugs. This process can take up a large percentage of the design cycle, resulting in many lost months of productivity.

FIG. 1 is a system diagram displaying the processing levels of an example system 100 ("GoldMine") used to generate assertions using data mining and static analysis. The system 100 may include, but not be limited to, a data generator 102, a static analyzer 104, an A-miner 110 (for assertion mining), counterexamples 112, a formal verifier 114 and an A-VAL evaluation and ranking module 120 ("A-VAL 120"). One or more processor may execute these components of the system 100 may be executed with support from memory and storage (discussed in more detail with reference to FIG. 30).

The data generator 102 simulates the RTL design and generates dynamic trace data. The static analyzer 104 extracts domain-specific information about the design that can be passed to A-Miner 110. The A-miner 110 mines candidate assertions from the trace data. The formal verifier 114 validates the guesses of the data miner and filters out incorrect guesses. The true assertions are passed to A-VAL 120 in the assertion evaluation phase as system invariants. In order to check if the likely invariants generated by A-Miner 110 are system invariants, the design and candidate assertions are passed through a formal verification engine, the formal verifier 114. If a candidate assertion fails formal verification, a counterexample 112 can be generated for feedback to the A-Miner 110, which continues to generate likely assertions. Additional description of FIG. 1 may be found in U.S. patent application Ser. No. 13/433,909, filed Mar. 29, 2012 and titled "Integration of Data Mining and Static Analysis for Hardware Design Verification," which is herein incorporated by this reference.

There is no standard methodology to evaluate or compare assertions. The methods used in A-VAL 120 to evaluate assertions so far have been either (a) subjective ranking using designers; or (b) insufficient and/or incomplete ways to objectify the "goodness" or value of an assertion.

A-VAL: Evaluation Metrics for Assertions

Once the system 100 has generated assertions, it is helpful to evaluate the assertions in the system design cycle. The A-VAL evaluation and ranking module 120 ("A-VAL 120") may be executed by a processor of a computing device and may also be executed by human evaluators and input as feedback (114) into the A-Miner 110.

Several insufficient metrics have been used to evaluate the performance of A-miner. One basic metric is the hit rate of true assertions. The hit rate of a run through the system 100 is the ratio of true assertions to candidate assertions. This provides a very crude indicator of performance. In addition, evaluators can consider output hit rate, which is the number of outputs for which the system 100 could generate a true assertion over the total number of inputs.

Another metric used by the inventors to evaluate an assertion is input space coverage of the assertion. It should be noted that this metric has no relation to standard coverage metrics such as code, branch, or path coverage. The reason for this is that those metrics are used for judging the quality of a directed test suite, which means that they cannot be applied to a set of individual assertions. One can evaluate the coverage of an assertion by considering the input space that is covered by the antecedent of the assertion. If one considers the truth table with respect to some output, each entry that corresponds to the propositions in the antecedent of an assertion is defined as covered by that assertion. For example, if there is an assertion (a=1&b=1 $\Rightarrow$ =1), one can consider the input space coverage to be 25% since we know that 25% of the truth table entries contain a=1, b=1. The reasoning behind this thinking is that if there is a set of assertions that covers each entry in the truth table of an output, that output is well covered by the set of assertions. This metric is straightforward to calculate since one can determine the percentage of the input space that an antecedent of an assertion covers without knowing every single input combination. The input space coverage may be defined as $\frac{1}{2}^{|P|}$ where |P| is the number of propositions in the antecedent. Based on this definition, it can be seen that the input space coverage is relative to the number of propositions in the antecedent. It should also be noted that this notion of coverage can be extended to sequential designs. If one considers an unrolled circuit where each signal, s, in the truth table is represented at the current time, s[t], one can consider the signal at each time cycle before it, for instance s[t−1], s[t−2], . . . , s[t−n]. Given that n is large enough, one may always be able to represent this coverage accurately in these terms.

Another objective metric may include antecedent size. This refers to the number of propositions in the antecedent (or precondition) of an assertion. A more concise assertion is preferable to a less concise one, so fewer propositions in an assertion is generally desirable.

Case Study of Rigel Multicore

Subjective rankings of assertions by a designer were generated in a case study of the Rigel Multicore RTL. Results were generated through applying the system 100 to the 1000+ core Rigel RTL design. The intention was to use assertions the system 100 generates to provide a regression test suite for the Rigel RTL that is in the later stages of its evolution. The system 100 generated assertions for three principal modules in Rigel: the writeback stage, the decode stage and the fetch stage. The writeback stage is a combinational module with interesting propositional properties. The decode and fetch stages are sequential modules with many interesting temporal properties.

The inventors performed some experiments to help evaluate the assertions the system 100 generated. The inventors performed an extensive designer ranking session for every phase of assertion generation of each module. Also, since the Rigel RTL does not have manual target assertions to compare against, the inventors performed a subjective, but intensive evaluation strategy. Rankings were from 1 to 4, calibrated as below:

1. Trivial assertion that the designer would not write;
2. Designer would write the assertion;
3. Designer would write, and captures subtle design intent; and
4. Complex assertion that designer would not write.

Figure 27:
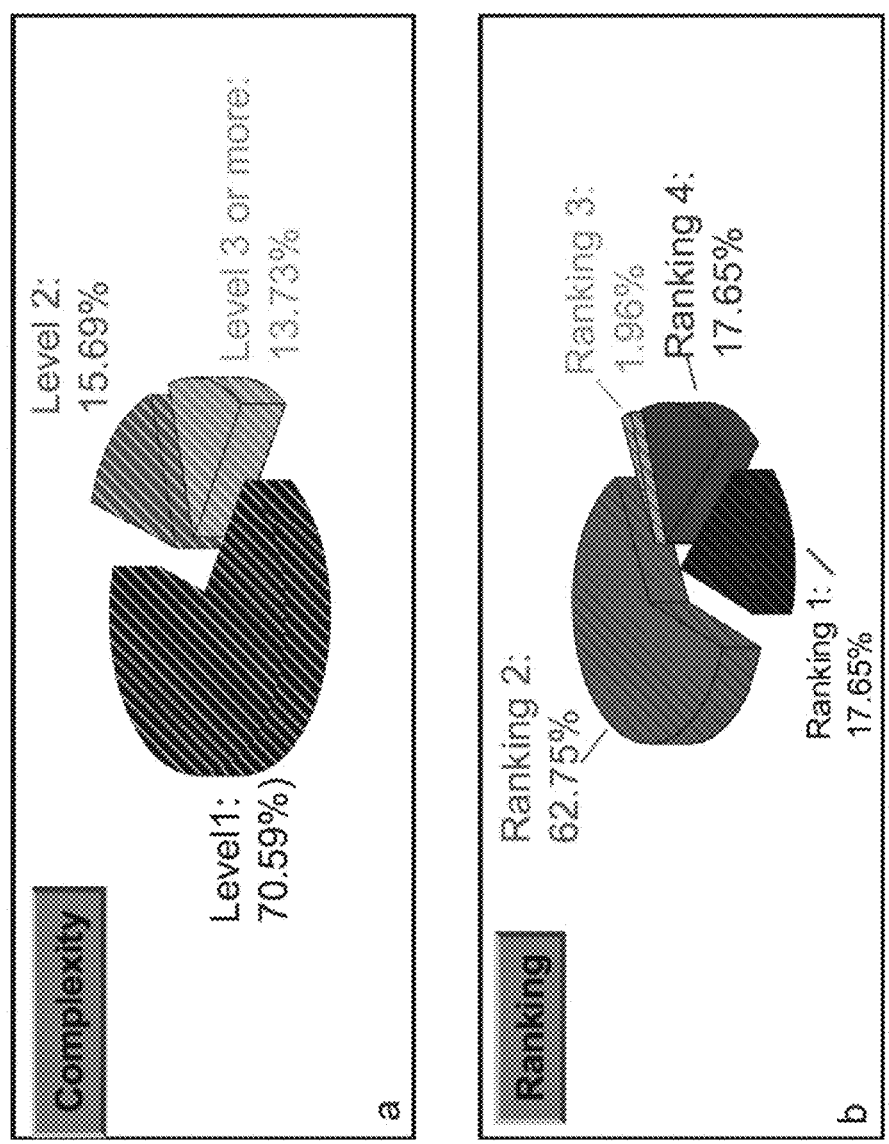
FIGS. 27A and 27B are, respectively, complexity and ranking graphs of results of sets of experiments performed on the Riegel RTL.

The results presented in FIG. 27B show the distribution of these ranks for a sample of representative assertions over all the modules. The algorithmic knobs that produced the highest hit rate as well as the highest number of assertions were turned on for this experiment. Most assertions in this analysis rank at 2. The writeback module has some assertions ranked 3. The absence of assertions ranked 3 in the sequential modules, according to the designers, is due to the fact that intra module behavior is not complicated enough to have many subtle relationships. For example, an assertion ranked 1 may be: if the halt signal in the integer, floating point and memory unit is set to 0, the halt signal is 0. In the RTL, the halt signal is a logical OR between the integer, floating and memory units. The system 100 found a true, but over-constraining rule. The designers ranked it 1, since they would not have written this rule. Now, consider this RTL code:

decode2mem.valid<=valid_mem &&
!issue_halt && !branch_mispredict &&
fetch2decode.valid && !follows_vld_branch An assertion ranked 2 may be: if branch_mispredict is high, decode2memvalid will be high in the next cycle. An assertion ranked 3 may be: if an integer unit does not want to use the first port, and the floating point unit does not want to use the second port, then the second port remains unused.

Complex Assertions

Despite the small size of the modules, the system 100 achieved rank 4, i.e. it produced assertions that capture complex relationships in the state space design of the RTL. This is an advantage of mechanically derived assertions: they are able to capture unintentional, but true, relationships that can be excellent counter checks and can be brought to the designer's attention. The inventors assessed the complexity by the number of levels (depth) of the design captured by assertions. In a few cases, the assertions capture temporal relationships that are more than 6 logic levels deep in the design. This provides a different perspective on the RTL, outside of the expectation, but may provide avenues for optimizing or analyzing the RTL. For example, the RTL has the following relationship:

if(choice_mem)

decode_packet<=decode_packet1;

An assertion ranked 4 may be: if (reset=0) and (issue0=0) and (decode_packet_dreg=0), and in the next cycle if(instr0_issued=0), then decode packet_dreg=0. This assertion relates to a single field in the decode_packet variable to reset and instrt0_issued, both of which are related to choice_mem when the code is traversed beyond 6 levels of (sequential) logic. Such a relationship would have been extremely hard to decipher through static analysis and code traversal. To the best of our knowledge, there is no state-of-the-art tool/technique that can claim to decipher such complex assertions. FIG. 27A shows the distribution of assertions with respect to complexity. The above metrics are ad-hoc, incomplete and computed in unsystematic ways. A more comprehensive, objective metric may be required to provide a figure of merit for assertions, which can be computed algorithmically.

Merit-Based Characterization of Assertions

In this work, the inventors introduce a "goodness metric" to evaluate RTL assertions. Two developments in RTL design verification have motivated this work. Firstly, assertions have transitioned from complicated high level model specifications written by few experts to widely used artifacts in hardware designs and verification instantiated in system-on-a-chip (SoC) designs. This is due to the burgeoning of assertion specification languages that presented a familiar interface to designers and verification engineers, as well as the support provided by commercial tools for assertion based verification. A recent survey reported that assertion usage in the hardware design industry has increased from 37% to 69% between 2007 and 2010. Because there are now many non-expert users who are required to write assertions, a quantification of the value of the assertions they write is useful. Secondly, the emergence of several automatic assertion generation techniques in the verification firmament has brought about changes to the traditional notion of assertions. Mechanical methods to generate assertions frequently produce a large number of assertions with non-uniform quality. These assertions can be verbose, irrelevant, covering unimportant behavior or that is incomprehensible. Also, a large number of assertions can discourage designers from parsing the assertions. An assertion-ranking scheme based on scores relative to key parameters that human beings look for may greatly ease the use of automatic assertion generation technology.

The inventors present an assertion quality metric that is based on two parameters—assertion importance and complexity. (Bounded LTL assertions will be expressed as (antecedent, consequent) pairs herein.) The inventors have developed an algorithm to compute the importance of an assertion. An assertion is important if it covers many important statements. An important statement is one that refers to important variables.

The algorithm for computing the importance of a variable in an RTL design using an algorithm may be inspired by Google®'s PageRank. PageRank represents the World Wide Web using a graph, where each node denotes a web page and each directed edge denotes a hyperlink from one page to another. PageRank analyzes the hyperlink structure of the World Wide Web graph to compute a score for each web page. The PageRank algorithm may be adapted to work for an RTL variable dependency graph, instead of the web graph.

The system computes a global importance score for a variable based on the entire variable dependency graph of the RTL. Although this provides a global ranking of all variables in the design, it does not capture the notion of relative importance between variables used in an assertion. For Google, PageRank was intended to be independent of individual queries to their search engine. Hence, the global ranking scheme was sufficient for its purpose. In the instant disclosure, however, the queries are assertions, whose "meaning" matters to us. The PageRank algorithm as such in insufficient for our purposes. Introduced, therefore, is a relative importance score that captures how important a variable is with respect to a target variable. This includes the spatial and temporal distance of the given variable from a target variable. The disclosed algorithm also incorporates the importance of the statements executed between the evaluation of the given variable and assignment of the target variable. Multiple assertions with the same target variable (or consequent) can be ranked using relative importance scores.

The relative importance score prefers variables that are spatially and/or temporally further from a given target variable. Consequently, assertions using such variables are ranked highly. Usually, such assertions cover a larger number of statements. Hence, these assertions would have a large number of propositions in their antecedents (or pre-conditions). As a result, the importance score is balanced (reduced) with a complexity score that is proportional to the number of propositions in an assertion's antecedent. This is justified because an assertion's usage is limited by its comprehensibility, and the greater the number of propositions in an antecedent, the more complex the assertion becomes.

Disclosed is also a detailed case study using an open source RTL implementation of the PCI (Peripheral Component Interconnected) protocol. The case study demonstrates that the disclosed assertion quality metric and ranking methodology both agree with human judgment. Complex assertions generated using an automatic assertion engine will be presented and an analysis of the choices made by the disclosed ranking methodology will be discussed.

PageRank

PageRank computes a score for each web page based on its incoming hyperlinks. Each web page may distribute its score equally amongst its outgoing hyperlinks. Consequently, the score for a web page is equal to the sum of the scores distributed to its incoming hyperlinks. A simplified PageRank formula formalizes this relationship.

Let $p_i$ denote a web page. Let $B_i$ denote the set of pages that have an outgoing hyperlink to $p_i$ and let $F_i$ denote the set of pages to which $p_i$ has outgoing hyperlinks. The simplified PageRank equation may be written as follows.

$$R(p_i) = \sum_{p_j \in B_i} \frac{R(p_j)}{|F_j|} \quad (1)$$

The PageRank formula adds an additional term to the simplified PageRank formula to account for random surfer behavior. Let $\epsilon$ be a constant between 0 and 1 and let n denote the total number of web pages. The PageRank formula may then be written as follows.

$$R(p_i) = (1-\epsilon) \sum_{p_j \in B_i} \frac{R(p_j)}{|F_j|} + \frac{\epsilon}{n} \quad (1a)$$

RTL Dependency Graph

The disclosed methodology ranks variables by analyzing an RTL dependency graph. An RTL dependency graph may be based on the semantics of the Verilog RTL. A left reference refers to a variable reference that appears on the left hand side of a Verilog assignment. A right reference refers to all variable references that are not left references. Let $v_i$ and $v_j$ denote two Verilog variables. Accordingly, $v_i$ depends on $v_j$ when there exists a Verilog assignment to $v_i$ that will execute only if a right reference to $v_j$ is evaluated.

Formally, a dependency graph may be described as a directed graph $G=(V, E)$ with vertices V and directed edges E. Let each vertex $v_i \in V$ denote a Verilog variable and let each directed edge $(v_i, v_j) \in E$ denote a dependence between variables $v_i$ and $v_j$. When $e_{ij}=(v_i, v_j) \in E$, then $v_j$ depends on $v_i$.

The disclosed methodology constructs two types of dependency graphs. A global dependency graph expresses dependencies between all variables in a Verilog design. The global dependency graph may be analogous to the dependency graph used by the classic cone of influence computation. A relative dependency graph transitively expresses dependencies for a given variable within a bounded number of cycles. The relative dependency graph for a given variable can be constructed using the global dependency graph and is analogous to the dependency graph used by the bounded cone of influence computation.

Assertion Quality Metrics and Ranking Methodology

The disclosed methodology may be viewed as including at least five phases. The first phase constructs a global dependency graph to compute a global importance score for each variable in the design. The second phase constructs a relative dependency graph for a given assertion to compute a relative importance score for each variable in the assertion's antecedent. The third phase uses the relative importance scores of the variables in the assertion's antecedent to compute the importance of the assertion. The fourth phase computes the complexity of the assertion. Finally, the fifth phase uses the importance of the assertion to compute its rank.

Global Variable Importance

The disclosed methodology adapts the PageRank computation to compute a global importance score for each variable in a Verilog design. The PageRank formula is derived from the intuition that important web pages have incoming hyperlinks from many important pages. Similarly, important variables may depend on many important variables. For example, a designer may intuitively consider a variable representing the next state in a state machine important. Consequently, such a variable would depend on other important variables, including those that determine the current state of the state machine.

The global variable importance formula may deploy a global dependency graph. A global dependency graph may be represented using an adjacency matrix. Let $a_{ij}$ denote the number of right references to variable i in all assignments to variable j. Let $a_i$ denote the number of right references to variable i in all assignments. Let A be an n×n square matrix with rows and columns corresponding to variables. Let $$A_{ij} = \frac{a_{ij}}{a_i}$$

when $a_i > 0$ and let $$A_{ij} = \frac{1}{n}$$

otherwise.

Intuitively, $A_{ij}$ is equal to the fraction of right references to variable i that exist in all assignments to variable j. If no references to variable i exist in the RTL, then it is assumed that a right reference to variable i exists in an assignment to each other variable. Hence, $A_{ij}=1/n$ when $a_j=0$. Such nodes with no outgoing edges may be referred to as dangling nodes and may be managed such as to ensure the importance score distribution models a probability distribution.

The disclosed methodology iteratively computes the global importance score of each variable in the design. Let $0<\epsilon<1$ be a constant source of global importance. Through experimentation, when $\epsilon=0.5$ the global importance score distribution agrees with designer intuition. Let r denote a global importance score vector over variables and let $r^k$ denote r in the kth iteration of the global variable importance computation. Let $$r_i^0 = \frac{1}{n}.$$

The global importance score of each variable n may be computed as follows.

$$r^{k+1} = (1-\epsilon)Ar^k + \frac{\epsilon}{n} \quad (2)$$

Equation 2 can iterate to convergence. However, we have found that 100 iterations compute the global importance score of each variable with a precision of up to 5 decimal places.

Global importance scores do not consider the functionality of the RTL. In other words, edges between nodes in the global RTL dependency graph are not affected by the operators used in their respective assignment. Hence, the global importance score estimates the "designer intended" importance of a variable. That is to say, if a variable has a high global importance score, then the designer considered that variable important in design implementation.

Relative Variable Importance

Designers are usually interested in a variable's importance within a specific functional context. However, global importance scores cannot convey such information. For example, consider a design with inputs a and b, and outputs $f_a$ and $f_b$. Suppose the design trivially assigns $f_a=a$ and $f_b=b$. Intuitively, the global importance scores of a and b would be equivalent since they are both inputs. However, when we consider the importance of a and b with respect to $f_a$, then we would expect the importance score of a to be greater than that of b since the value of $f_a$ is not affected by the value of b. We compute relative importance scores to measure the relative importance of one variable with respect to another.

Additional examples are presented to illustrate why global importance scores are insufficient for estimating an assertion's importance. Each example presents a set of assertions. For each assertion, we discuss the relative importance score of each variable in the assertion's antecedent with respect to the variable in its consequent. We assume that each variable in each assertion's antecedent is an input variable. Consequently, the global importance score of each such variable will be equivalent.

1. Spatial distance—Consider the assertions $a \Rightarrow f$ and $b \Rightarrow f$ Suppose the spatial distance between a and f is 3 assignments while that between b and f is 1 assignment. Intuitively, a should have a higher importance score than b with respect to f since the spatial distance between a and f is greater than that between b and f.

2. Temporal distance—Consider the assertions $a \Rightarrow XXf$ and $a \Rightarrow f$. Both assertions reference a in their antecedents. However, the first assertion references a in a previous temporal frame. Therefore, we can rewrite the first assertion as $a^{-2} \Rightarrow f$. Since the temporal distance between $a^{-2}$ and f is greater than that between a and f, $a^{-2}$ should have a higher importance score than a with respect to f 3. Execution path importance—Consider the assertions $a \Rightarrow f$ and $b \Rightarrow f$. Suppose the spatial distances between a and f and b and f are both equal to 3 assignments. When the assignments between a and f reference variables with higher global importance scores than those between b and f, then a should have a higher importance score than b with respect to f.

Global importance scores cannot capture the concepts presented in the previous set of examples. Therefore, relative importance scores are computed. Let $I_r(v, v_t)$ denote the relative importance score of variable v with respect to target variable $v_t$. In any practical design, $v_t$ would depend on many variables. It is unreasonable to consider each of these variables equally important with respect to $v_t$. Consequently, $I_r(v, v_t)$ is determined based on the global importance scores of the variables referenced between references to v and assignments to $v_t$.

Algorithm 1 (FIG. 3) constructs a relative dependency graph for a target variable and computes a relative importance score for each variable in the graph. The algorithm constructs relative dependency graph $G_r=(V_r, E_r)$. The algorithm takes inputs v, k and $v_t$. Input v denotes the current variable in the depth first construction of the relative dependency graph, k denotes the current temporal index, and $v_t$ denotes the target variable.

Algorithm 1 may operate according to the following definitions. Let $k_{max}$ denote the maximum temporal length of the relative dependency graph. Let $G_g=(V_g, E_g)$ denote the global dependency graph and let the function dependencies(v)= $\{v_i \in V_g | (v_i, v) \in E_g\}$. That is, dependencies(v) returns the set of variables on which v depends within 1 temporal frame. Let the function $I_g(v)$ return the global importance score of v. Finally, let the function temporal(v) be satisfied when assignments to v span multiple temporal frames.

Algorithm 1 begins by checking if $k<k_{max}$. When $k<k_{max}$, then the algorithm terminates. Otherwise, for each variable on which v depends, the algorithm adds a new node and edge to $G_r$. The algorithm computes the relative importance score $i_r$ of $v_i^{-k}$ by summing the global importance score of $v_i$ and relative importance score of v with respect to $v_t$. Next, for each variable $v_i$ on which v depends, the algorithm increases k if $v_i$ is temporal and recurses.

If $v_t$ is a sequential variable, then it will have temporal dependencies. Let temporal variable $v^k$ with temporal index k denote variable v backward in time k cycles relative to the assignment of $v_t$. The disclosed methodology treats each such variable as a unique variable. For example, $I_r(v, v_t) \neq I_r(v^1, v^t)$. If there is a cycle in the dependency graph of $v_t$, then it will depend on an infinite number of temporal variables. Consequently, the methodology computes a relative importance score for each variable on which $v_t$ depends within a bounded number of cycles.

Below are examples to illustrate how relative importance scores capture information that global importance scores cannot. Each example presents a set of assertions. For each assertion, we discuss the relative importance score of each variable in the assertion's antecedent with respect to the variable in its consequent. For each assertion, it is assumed that each variable in the assertion's antecedent is an input variable. Consequently, the global importance score of each variable in a given assertion's antecedent will be equivalent.

Relative importance scores also measure the spatial and temporal distance between references to a variable and assignments to a target variable. For example, consider the assertions $a \Rightarrow f$ and $b \Rightarrow f$. Suppose that a propagates through three (3) assignments before it is assigned to f, while b is assigned directly to f. Intuitively, a should have a higher importance score than b with respect to f due to a difference in spatial distance. Relative importance scores may capture such differences while global importance scores may not.

Consider the assertions $a \Rightarrow XXf$ and $a \Rightarrow f$. While both assertions use input a in their antecedents, the first assertion uses a as a temporal variable. Consequently, the first assertion may be rewritten as $a^2 \Rightarrow f$. Intuitively, the $a^2$ will propagate through more assignments than a before it is assigned to f. Therefore, $a^2$ should have a higher importance score than a due to a difference in temporal distance. Relative importance scores may capture such differences while global importance scores may not.

Relative importance scores also measure the importance of the execution paths between references to a variable and assignments to a target variable. Again, consider the assertions $a \Rightarrow f$ and $b \Rightarrow f$ Suppose, however, that both a and b propagate through three (3) assignments before they are assigned to f. Additionally suppose that the assignments through which a propagates refer variables with higher global importance scores than those through which b propagates. Accordingly, a should have a higher importance score than b with respect to f due to a difference in importance of execution paths. Relative importance scores may capture such differences while global importance scores may not.

Relative importance scores measure the spatial distance, temporal distance, and importance of execution paths between references to a variable and assignments to a target variable. An important assertion will have high spatial distance, high temporal distance, and cover important execution paths between the satisfaction of its antecedent and consequent. Consequently, our methodology uses relative importance scores to compute the importance score of an assertion.

Let $P_i$ denote assertion i, let $A_i$ be the set of variables in the antecedent of $P_i$ and let i be the variable in the consequent of $P_i$. The importance score of an assertion may be computed as follows.

$$I_a(P_i) = \sum_{v_i \in A_i} I_r(v_i, c_i) \quad (3)$$

Assertion importance scores estimate the "important execution path" coverage for a given assertion. In other words, if an assertion has a high importance score, than it covers important execution paths. For example, an assertion that covers one important execution path might have a higher importance score than one that covers many unimportant execution paths. Consequently, assertion importance scores strongly estimate the value of an assertion.

Complexity

Assertions with high importance scores might be difficult to understand. To understand such assertions, a designer might need to parse complex expressions and reason about multiple temporal frames. Consequently, these assertions will have limited use and value. Therefore, the system computes the complexity score of an assertion to convey its understandability. The system computes the complexity score of an assertion in two subphases. The first subphase computes a relative complexity score for each variable in the assertion's antecedent. The second subphase uses the relative complexity scores of the variables in the assertion's antecedent to compute its complexity score.

Relative Variable Complexity

The inventors devised relative complexity scores based on the process required to understand the meaning of an assertion. Suppose a designer would like to understand the assertion a XXf. First, the designer would need to search the design for all assignments to f. Next, the designer would need to transitively parse the set of assignments that assign to f. The designer would continue this process until encountering an assignment that references a. After finding all such assignments, the designer would reason about them to understand how the assignments satisfy the assertion.

A complexity score of a variable is computed based on the following observations. First, understanding the semantics of a variable reference in a large expression will require more effort than doing so for a small expression. Therefore, a variable's relative complexity score should be proportional to the size of expressions that reference it. Second, understanding the dependence between variables that are spatially or temporally distant requires more effort than doing so for those that are spatially or temporally close. Therefore, a variable's relative complexity score should depend on variables that it assigns.

Algorithm 2 (FIG. 4) constructs a relative dependency graph for a target variable and computes a relative complexity score for each variable in the graph. Algorithms 1 and 2 share definitions for Gr, v, k, vt, kmax, dependencies(v) and temporal(v). Algorithm 2 requires the following additional definitions. Let the function expressions(v) return the set of expressions on which v depends within 1 (one) temporal frame. Let the function sensitivities(v) return the set of expressions that reference v.

Algorithm 2 begins by checking if k<kmax. When k<kmax, then the algorithm terminates. Otherwise, for each variable $v_i$ on which v depends, the algorithm adds a new node and edge to Gr. Algorithm computes the relative complexity score $c_r$ of $v_i^{-k}$ by summing the sizes of the expressions in $X \cup S$, which includes expressions that both assign to v and reference $v_i$. Next, for each variable $v_i$ on which v depends, the algorithm increases k if $v_i$ is temporal, and recurses.

A complex assertion should have high spatial distance, high temporal distance, and/or cover complex execution paths between the satisfaction of its antecedent and consequent. Therefore, the system uses relative complexity scores to compute the complexity score of an assertion since they measure these attributes.

Let p denote an assertion, let $V_a$ be the set of variables in the antecedent of p and let $v_c$ be the variable in the consequent of p. Let $C_r(v, v_t)$ denote the relative complexity score of variable v with respect to target variable $v_t$. The complexity score C(p) of p may be computed as follows:

$$C(p) = \sum_{v_i \in V_a} C_r(v_i, v_t) \quad (4)$$

Equation 4 considers all variables in the antecedent of an assertion equally. In other words, it makes no difference how variables are related to one another via operators. Each variable contributes its relative complexity score to an assertion each time it appears in the assertion's antecedent.

An assertion's complexity score reflects the relative complexity of the variables in its antecedent with respect to the variable in its consequent. A variable's relative complexity score depends transitively on the relative complexity scores of the variables it assigns. Therefore, a variable with a high relative complexity score constitutes a complex execution path. Consequently, an assertion's complexity score estimates its complex execution path coverage. As a result, an assertion with a high complexity score conveys behavior that is difficult to understand with respect to the design.

Assertion Ranking

Assertion importance and complexity scores are useful in estimating the value of an assertion. If a designer evaluated a set of assertions based on their importance and complexity, then they would prefer assertions that maximize importance with respect to complexity. The system utilizes this idea to compute the rank score of an assertion. Let p denote an assertion. The system computes the rank score R(p) of p as follows:

$$R(p) = \frac{I(p)}{C(p)} \quad (5)$$

Equation 5 is simple, but effective. Intuitively, an assertion that conveys the most important behavior in the least complex way should have greater value than any other assertion.

Assertion rank scores do not evaluate the semantics of an assertion. Such an analysis would be subjective and arbitrary. Instead, the assertion rank computation relies on the structural analysis techniques used by the assertion importance and complexity computations to compute an assertion's rank score. Consequently, the computation is general, consistent and efficient. In addition, it is not limited by assertions with complicated semantics.

Ideality

Assertion rank scores are absolute. This raises a question regarding the existence of an ideal assertion. An ideal assertion is one whose rank score is equal to the maximum assertion rank score for a given target variable and temporal bound. The ideal assertion's rank score may be used to compute another assertion's ideality score. Let V denote the finite set of variables target variable $v_t$ depends on within temporal bound k. Let $\pi$ denote the ideal assertion for $v_t$ and k. Based on Equation 5, the rank score of $\pi$ has the following form.

$$R(\pi) = \frac{\sum_{v_i \in V} I_r(v_i, v_t)}{\sum_{v_i \in V} C_r(v_i, v_t)} \quad (6)$$

The system can compute $R(\pi)$ by selecting the subset $V_\pi$ of V that maximizes Equation 6. Next, we prove that $V_\pi$ includes only the variable with the maximum relative importance score to complexity score ratio.

Let $v_\pi \in V$ denote the variable with the maximum relative importance score to complexity score ratio. Let $$R_r(v, v_t) = \frac{I_v(v, v_t)}{C_r(v, v_t)}$$

denote the relative rank score of v with respect to $v_t$. We would like to prove $V_\pi = \{v_\pi\}$, given $R_v(v_\pi, v_t) \geq R_r(v_i, v_t)$, $\forall v_i \in V$. To do so, we show that including another variable in $V_\pi$ can only decrease $R(\pi)$. Therefore, we prove the following.

$$\left(R_v(v_\pi, v_t) \geq R_r(v_i, v_t) \Longrightarrow R_r(v_\pi, v_t) \geq \frac{I_r(v_\pi, v_t) + I_r(v_i, v_t)}{C_r(v_\pi, v_t) + C_r(v_i, v_t)}\right), \forall v_i \in V$$

Proof. Let $I_\pi$, $C_\pi$ and $R_\pi$ denote $I_r(v_\pi, v_t)$, $C_r(v_\pi, v_t)$ and $R_r(v_\pi, v_t)$ respectively. Let $I_i$, $C_i$ and $R_i$ denote $I_r(v_i, v_t)$, $C_r(v_i, v_t)$ and $R_r(v_i, v_t)$ for any $v_i \in V$ respectively. Accordingly, $$R_\pi \geq R_i$$

$$\frac{I_\pi}{C_\pi} \geq \frac{I_i}{C_i}$$

$$I_\pi \cdot C_i \geq I_i \cdot C_\pi$$

$$I_\pi \cdot C_i + I_\pi \cdot C_\pi \geq I_i \cdot C_\pi + I_\pi \cdot C_\pi$$

$$I_\pi \cdot (C_\pi + C_i) \geq C_\pi \cdot (I_\pi + I_i)$$

$$\frac{I_\pi}{C_\pi} \geq \frac{I_\pi + I_i}{C_\pi + C_i}$$

Let p denote an assertion. The system computes the ideality i(p) score of p as follows:

$$\iota(p) = \frac{R(p)}{R(\pi)} \quad (7)$$

Equation 7 normalizes an assertion's rank score with respect to the ideal assertion's rank score. Consequently, an assertion's ideality score conveys its completeness with respect to the design.

FIG. 5 depicts the Verilog source code for a 2-port arbiter. The arbiter uses the temporary variable gnt_ to guarantee that neither request line is starved. Suppose a verification engineer writes the following assertions for the arbiter.

a0: (req2==1 && gnt_==1) ##1
(req1==1)|->
(gnt1==1)
a1: (req1==0) ##1 (req1==1)|->
(gnt1==1)
a2: (req1==0)|->(gnt1==0)
a3: (req1==1 && req2==0)|->
(gnt1==1)

Assertions a0 and a1 express nontrivial temporal properties while a2 and a3 express trivial combinational properties. Therefore, we expect both the importance and complexity scores of a0 and a1 to be higher than those of a2 and a3.

Figure 6:
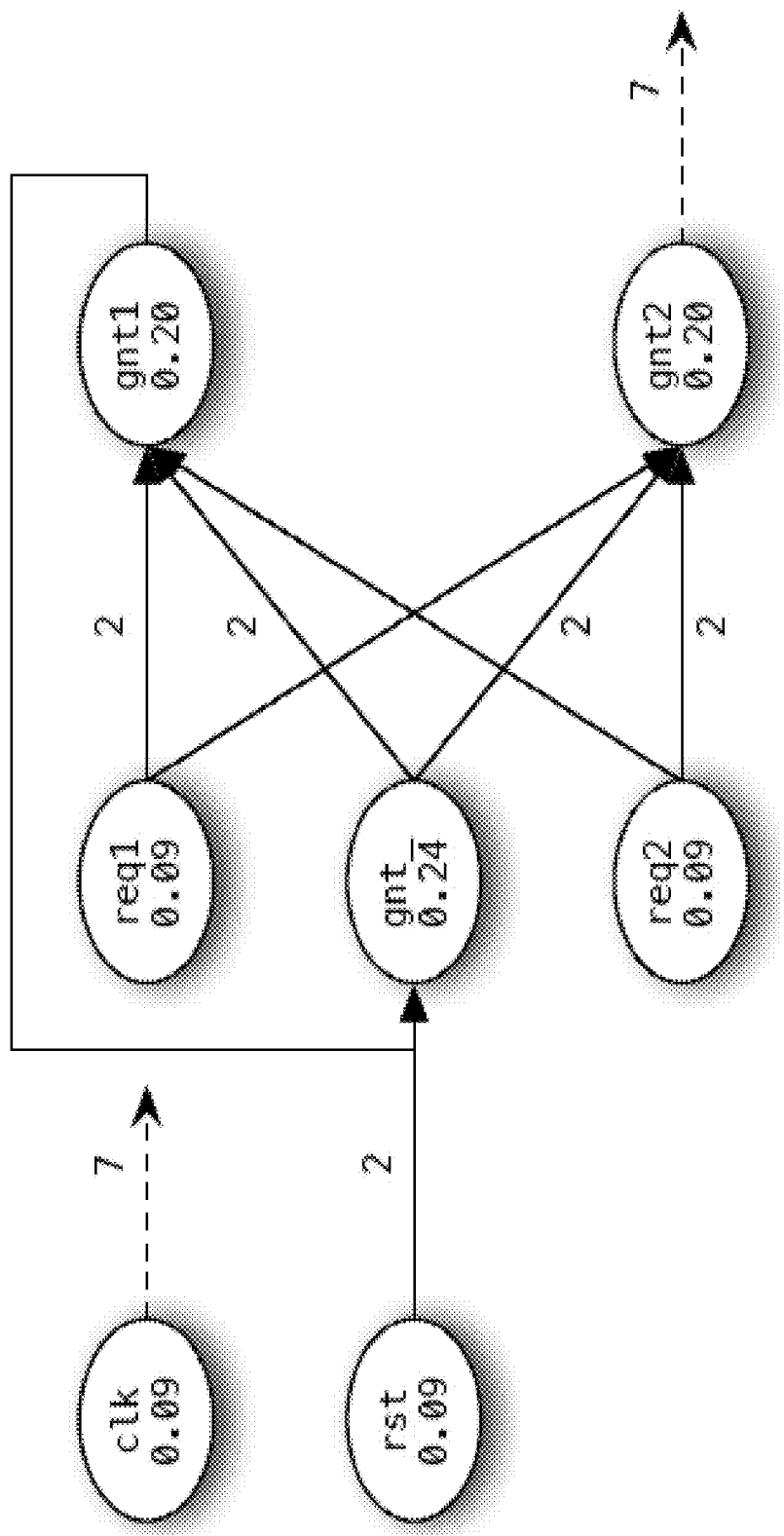
FIG. 6 is a global dependency graph for the 2-port arbiter of FIG. 5, where each node's $I_g$ value denotes its global importance score.

FIG. 6 depicts the global dependency graph constructed in the first phase of the methodology. Each node is labeled with its respective variable and global importance score. Edge weights denote the number of dependencies between two variables. For example, because gnt1 depends on req1 in both lines 19 and 24 of the Verilog (FIG. 5), the weight of edge (req1, gnt1) is equal to 2. Unweighted edges have an implicit weight equal to 1.

Figure 7:
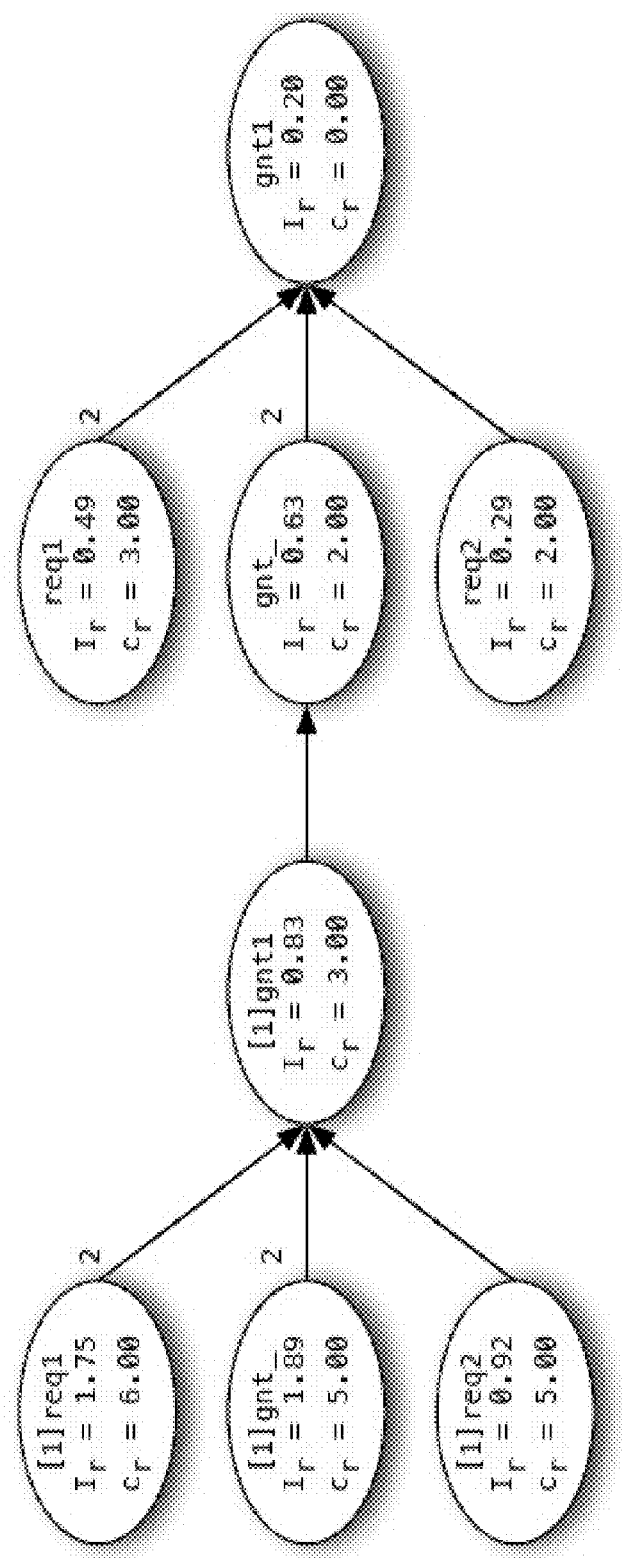
FIG. 7 is a relative dependency graph for a first guarantee to access of a request (gnt1), where each node's $I_r$ and $C_r$ values denote relative importance and complexity scores of respective nodes.

Algorithms 1 and 2 are simultaneously discussed as they are similar structured and share definitions. FIG. 7 depicts the relative dependency graph constructed for gnt1 in the second phase of the methodology. Because the maximum temporal length of all assertions is equal to 2, $k_{max}=2$. The algorithms begin with v=gnt1, k=0 and $v_t$=gnt1. Line 2 checks if k<$k_{max}$. Since k<$k_{max}$, the algorithm continues.

Line 3 of Algorithm 2 initializes the set X to the set of expression that assign gnt1 within one (1) temporal frame. Therefore, V={gnt_, req1 & ~req2, req1}. Lines 6 through 11 add nodes for each of these variables to the relative dependency graph. Line 3 (4) in Algorithm 1 (3) initializes V to the set of variables that assign gnt1 within 1 temporal frame. Therefore, V={req1, req2, gnt_}. Lines 4 (5) through 8 (13) add nodes for each of these variables to the relative dependency graph.

Consider req1. In Algorithm 1, line 5 computes the relative importance score of req1 as Ir(req1, gnt1)=2*0.20+0.9=0.49. Because gnt1 refers req1 in two assignments, gnt1 contributes its relative importance score to the relative importance score of req1 twice. In Algorithm 2, line 6 initializes S to the set of expressions that reference req1. Therefore, S={req1&~req1, req1}. Line 8 computes X∪S=S and lines 8 through 10 compute the relative complexity score of req1 as Cr(req1, gnt1)=2+1=3.

Lines 9 (14) through 15 (20) recurse algorithm 2 (3). Since req1 and req2 are inputs, they do not depend on any variables. Therefore, the algorithms will terminate in each of these recursive calls. When the algorithms recurse on gnt_, they will increment k since gnt_ is temporal. Algorithms 2 and 3 terminate when k_kmax or when V=0.

Next, the importance score of each assertion is computed as follows:

$$I(a0)=0.92+1.80+0.49=3.30$$

$$I(a1)=2.24$$

$$I(a2)=0.49$$

$$I(a3)=0.72$$

Similarly, the importance scores of the complexity score of each assertion may be computed as follows:

$$C(a0)=5.00+5.00+3.00=13.00$$

$$c(a1)=9.00$$

$$c(a2)=3.00$$

$$c(a3)=5.00$$

Finally, the rank score of each assertion may be computed as follows:

$$R(a0) = \frac{I(a0)}{C(a0)} = 0.254$$

$$R(a1) = \frac{I(a1)}{C(a1)} = 0.249$$

$$R(a2) = \frac{I(a2)}{C(a2)} = 0.163$$

$$R(a3) = \frac{I(a3)}{C(a3)} = 0.144$$

Case Study

In this section we qualitatively evaluate the performance of our methodology. We used a proprietary automatic assertion generation engine (GoldMine) for the Peripheral Component Interconnect (PCI) bridge master state machine. We used our methodology to rank the assertions. The relevant Verilog source code for the PCI bridge master state machine module is shown in FIGS. 12A, 12B and 12C.

The PCI bridge connects a PCI host device with a PCI bus. The master state machine of the PCI bridge is responsible for executing requests to target devices. To execute a request, the state machine acquires control of the PCI bus. Next, the state machine broadcasts the target address and command, and waits for the target to respond. Finally, the state machine transfers data between the host and target.

The system analyzes the highest and lowest ranked assertions for output pci_frame_en_out from the master state machine. Output pci_frame_en_out is the enable signal for the pci_frame_out output. Output pci_frame_out signals that the master state machine is transferring data on the bus. During a transfer, pci_frame_out should be enabled unless a master abort occurs.

GoldMine generated 36 true assertions for pci_frame_en_out—ranked as follows:

a1: (cur_state[3]==1) ##1
(rdy_in==0)|->
(pci_frame_en_out==0)
a36: (rdy_in==0) ##1
(pci_frame_out_in==1 &&
pci_trdy_in==0 &&
rdy_in==0)|->
(pci_frame_en_out==0)

Assertions a1 and a36 were the highest and lowest ranked assertions respectively. We justify this ranking and show the difference in quality between these assertions. Assertion a1 expresses the property if the state machine's current state is turn around and one cycle later the host is not ready to send or receive data, then disable pci_frame_out.

Consider the first cycle of a1. The proposition cur_state[3]==1 conveys that the design's current state is turn around. Careful inspection of the Verilog reveals that the design will change state only if signal change_state is asserted. Lines 43 through 48 reveal that since the design's current state is turn around, change_state is asserted. Consequently, the design's next state is idle.

Consider the second cycle of a1. Because the design's current state is idle, the proposition rdy_in==0 ensures that frame_en_slow is not asserted on line 29. In addition, frame_en_keep is not asserted on line 30. Because both frame_en_slow and frame_en_keep are not asserted, pci_frame_en_out is not asserted on lines 32 and 33. Therefore, pci_frame_out will be disabled.

Assertion a36 expresses the property if the host is not ready to transfer data and one cycle later the host is still not ready to transfer data and the target is not ready to transfer data and the master state machine is not transferring data, then disable pci_frame_out.

Consider the second cycle of a36. The proposition pci_trdy_in==0 ensures that the second disjunctive term on line 33 is not asserted. Therefore, we consider the logic for frame_en_slow on lines 29 through 30. The propositions rdy_in==0 and pci_frame_out_in==1 ensure that the first and third disjunctive terms on lines 29 through 30 are not asserted. Therefore, pci_frame_en_out is asserted only if the design's current state is address. Consequently, pci_frame_en_out is asserted only if the design's previous state was idle.

Consider the first cycle of a36. The proposition rdy_in==0 ensures that change_state on lines 47 through 48 is not asserted. Since the design's current state is idle, the second disjunctive term on line 48 is not asserted. Therefore, we consider the logic for ch_state_med on lines 45 through 46. The proposition rdy_in==0 ensures that the second disjunctive term on line 46 is not asserted. Therefore, we consider the logic for ch_state_slow on lines 43 through 44. Because the design's current state is idle, ch_state_slow is not asserted. Because the design's current state is idle and change_state is not asserted, the design's next state cannot be address. Therefore, pci_frame_en_out will not be asserted and pci_frame_out will be disabled.

Assertion a1 is consistent with PCI specification. In addition, it is not trivial recitation of the Verilog. In contrast, a36 is convoluted with respect to the PCI specification. While the assertion is not a trivial recitation of the Verilog, it is difficult to understand. Hence, a1 is ranked higher than a36. Intuitively, a verification engineer would consider a1 more valuable than a36.

EXPERIMENTAL RESULTS

In this section we present experimental results for the assertion ranking methodology. We used GoldMine to generate 260 assertions for the PCI bridge master state machine. We used the assertion ranking methodology to rank the assertions.

The first experiment validates the global variable importance computation. FIG. 9 shows the positional rank and positional rank percentile of each output in the PCI bridge master state machine. A variable's positional rank is equal to its numerical position in a list of all variables descendingly ordered according to their global importance scores. In general, FIG. 9 shows that output variables are ranked highly.

Figure 10:
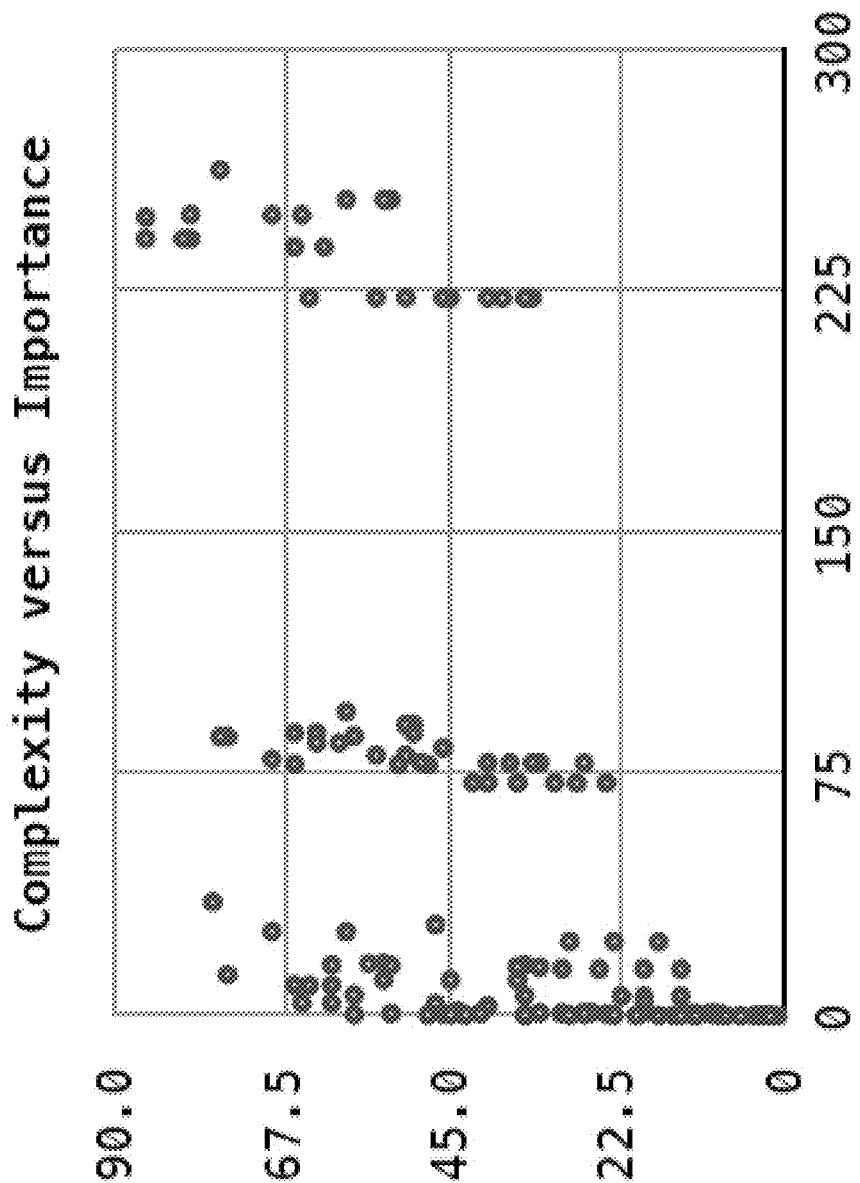
FIG. 10 is a scatter graph showing assertion complexity as a function of importance.

The next set of experiments validate rank score computation. FIG. 10 correlates assertion importance and complexity. The figure shows that assertion importance weakly correlates with complexity. Therefore, despite the similarity of Algorithms 1 and 2, assertion importance and complexity are not dual metrics.

Figure 11:
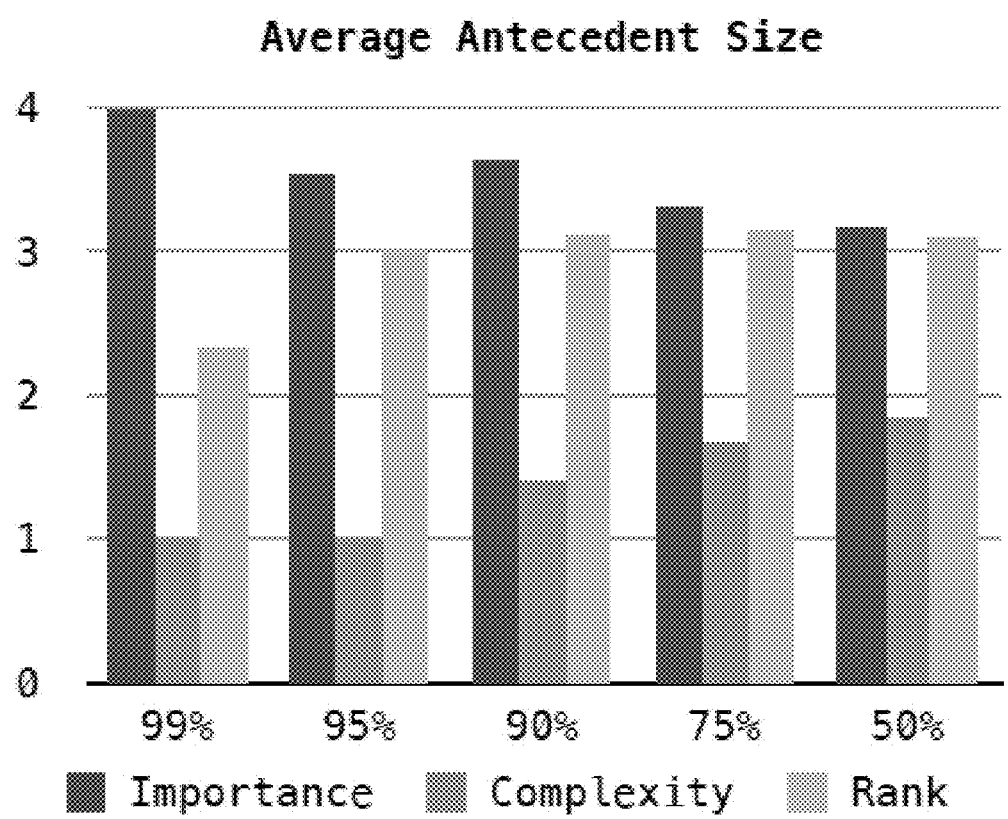
FIG. 11 is a bar graph of the average antecedent size of assertions of the PCI bus design in the 99th, 95th, 90th, 75th and 50th importance, complexity and rank percentiles.
Figure 12:
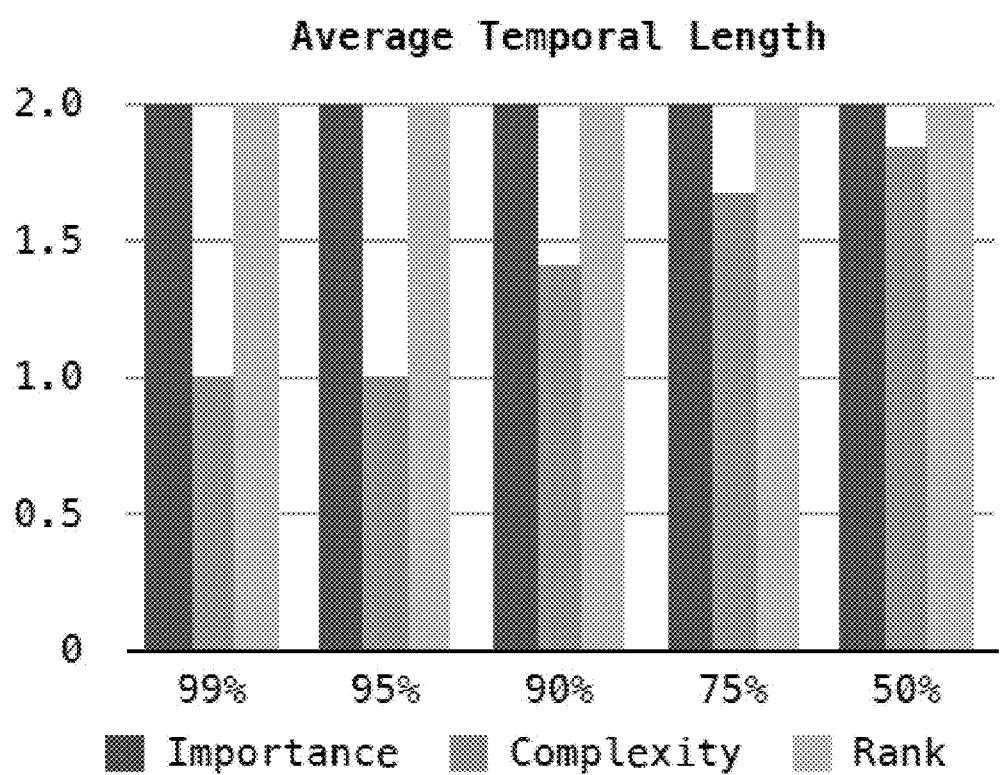
FIG. 12 is a bar graph of the average temporal length of assertions of the PCI bus design in the 99th, 95th, 90th, 75th and 50th importance, complexity and rank percentiles.

FIGS. 11 and 12 show the average antecedent size and temporal length of assertions in the 99th, 95th, 90th, 75th and 50th importance, complexity and rank percentiles. We observe the following from these figures. First assertions that have high importance also have high antecedent sizes and high temporal length. Second, assertions that have low complexity also have low antecedent sizes and low temporal length. Finally, assertions that have high rank also have moderate antecedent sizes and high temporal length.

Figure 13:
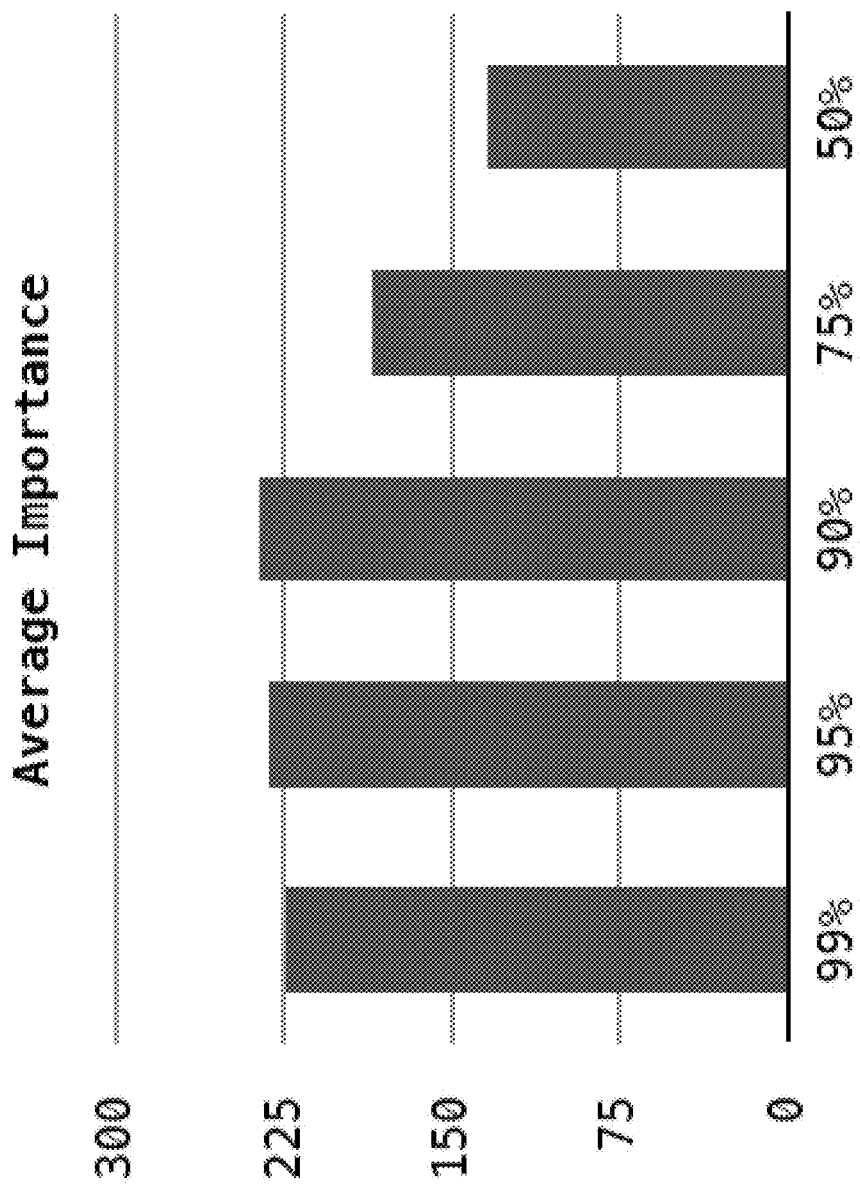
FIG. 13 is a bar graph of the average importance score of assertions of the PCI bus design in the 99th, 95th, 90th, 75th and 50th rank percentile
Figure 14:
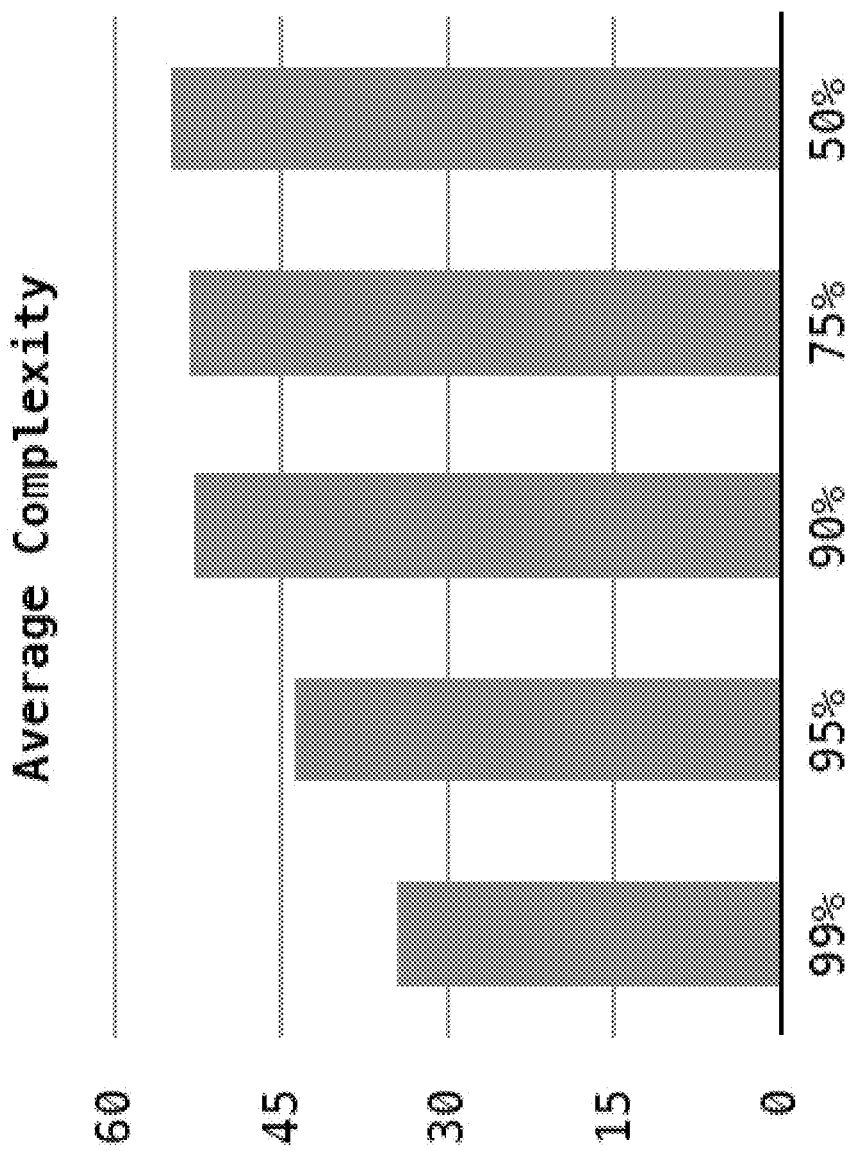
FIG. 14 is a bar graph of the average complexity score of assertions in the 99th, 95th, 90th, 75th and 50th rank percentile.

FIGS. 13 and 14 show the average importance and complexity of assertions in the 99th, 95th, 90th, 75th and 50th rank percentile. We observe the following from these figures. First, assertions that have high rank also have high importance. Second, assertions that have high rank also have low complexity. Finally, assertions that have high rank will not necessarily have the highest importance.

FIG. 15 shows the ideality of the lowest, middle and highest ranked true assertions for each target variable. For most target variables, GoldMine was able to generate an ideal or nearly ideal assertion. GoldMine was unable to generate an ideal assertion for retry_out.

Assertion Coverage

Assertion coverage estimates the fraction of design functionality covered by an assertion. Previous work has proposed methods to compute the fraction of the state space covered by an assertion. However, these methods are intractable since they must enumerate the entire state space of the design. In previous work, the authors propose a correctness based coverage algorithm to compute the fraction of RTL statements covered by an assertion.

The correctness based coverage algorithm computes the set of statements executed after the satisfaction of an assertion's antecedent. If an executed statement transitively satisfies the assertion's consequent, then the assertion covers that statement. The algorithm proceeds as follows. Let p denote an assertion with temporal length k. First, the algorithm initializes S so that it satisfies the antecedent of p. Next, the algorithm performs an event-based simulation of $\pi$ for k temporal frames. During simulation, the algorithm records the statement that assigns each $v \in V$ in each temporal frame. Finally, the algorithm adds the transitive set of statements that satisfied each proposition in the consequent of p to the set of statements it covers.

Assertion Rank Aggregation Methodology

The methodology consists of three phases. The first phase computes a set of rankings for a set of assertions. The second phase computes a rank aggregation for the assertions. The final phase uses a process called local Kemenization to optimize the aggregation.

The first phase of the rank aggregation methodology computes a set of rankings for the assertions and aggregates ranking results from various sources to generate an optimal ranking. Rank aggregation algorithms are capable of combining an arbitrary number of rankings. In general, this phase will depend on the metrics selected for aggregation. The system computes an assertion rank aggregation using four metrics—assertion importance, complexity, coverage and expectedness. In short, assertion importance and complexity estimate the importance and understandability of the behavior conveyed by an assertion respectively.

Let $\pi$ denote a Verilog design with variables V. We refer to $\pi$ as the target design. We structure a simulation S of $\pi$ as follows. Let B={0,1} denote the Boolean number set. Let S be a set of Boolean vectors and let $s \in S$ be a Boolean vector in $B^{|V|}$ that assigns a Boolean value to each $v \in V$. Let s(v) denote the value of variable v in s.

The system modifies the correctness-based coverage algorithm to consider only the set of assignments covered by an assertion. Let $\pi$ denote the total number of assignments in $\pi$ and let $\alpha_p$ denote the number of assignments covered by p. We compute the coverage R(p) of p as follows:

$$R(p) = \frac{\alpha_p}{\alpha} \tag{8}$$

Since each assignment constitutes an execution path in the design, Equation 8 effectively computes an assertion's execution path coverage.

Expectedness

Assertion expectedness estimates the probability that an assertion's antecedent will be satisfied—assuming the design's inputs vary uniform-randomly. Assertions with low expectedness convey design behavior that occurs rarely. Consequently, the system ranks assertions with low expectedness higher than those with high expectedness. The system uses simulation techniques to estimate an assertion's expectedness.

Let p denote an assertion and let A denote the set of propositions in the antecedent of p. We compute the expectedness E(p) of p as follows:

$$E(p) = \frac{|\{s \in S \mid \forall \, (v, b) \in A, \, s(v) = b\}|}{|S|} \tag{9}$$

Equation 9 computes an assertion's simulation trace coverage.

Aggregation

The system uses the footrule aggregation algorithm to aggregate a set of assertion rankings since the footrule aggregation algorithm computes an aggregation that approximates that of the Kemeny-Young method. Let $\tau_a$ denote a rank aggregation of n assertions. Let G=(P, R, E) denote a bipartite graph with nodes P and R and weighted edges E. Each node p∈P denotes an assertion and each node r∈R denotes one of n available ranks in $\tau_a$. Note that a perfect matching for G implicitly defines an assertion ranking.

Let T denote a set of assertion rankings. The system computes the weight W(p, r) of edge (p, r)∈E as follows:

$$W(p, r) = \sum_{\tau_i \in T} |\tau_i(p) - r| \qquad (10)$$

The intuition behind Equation 10 is as follows. Suppose we assigned assertion p to rank r in a hypothetical $\tau_a$. For each $\tau_i \in T$, Equation 10 computes the Spearman footrule distance between r and $\tau_i(p)$. Because the final result of Equation 10 is equal to the sum of these distances, it effectively computes the cost of assigning assertion p to rank r in a hypothetical $\tau_a$.

An optimal assertion rank aggregation will minimize W(p, r) for each p∈P. Therefore, we would like the system to compute a minimum cost perfect matching for G. Such a matching will implicitly define an optimal assertion rank aggregation. The system executes the Kuhn-Munkres algorithm to compute a minimum cost perfect matching for G.

Experimental Results

In this section we present experimental results for the rank aggregation methodology. We used GoldMine to generate 260 assertions for the PCI bridge master state machine. We used the rank aggregation methodology to aggregate rankings for assertion importance, complexity, coverage and expectedness.

Figure 16:
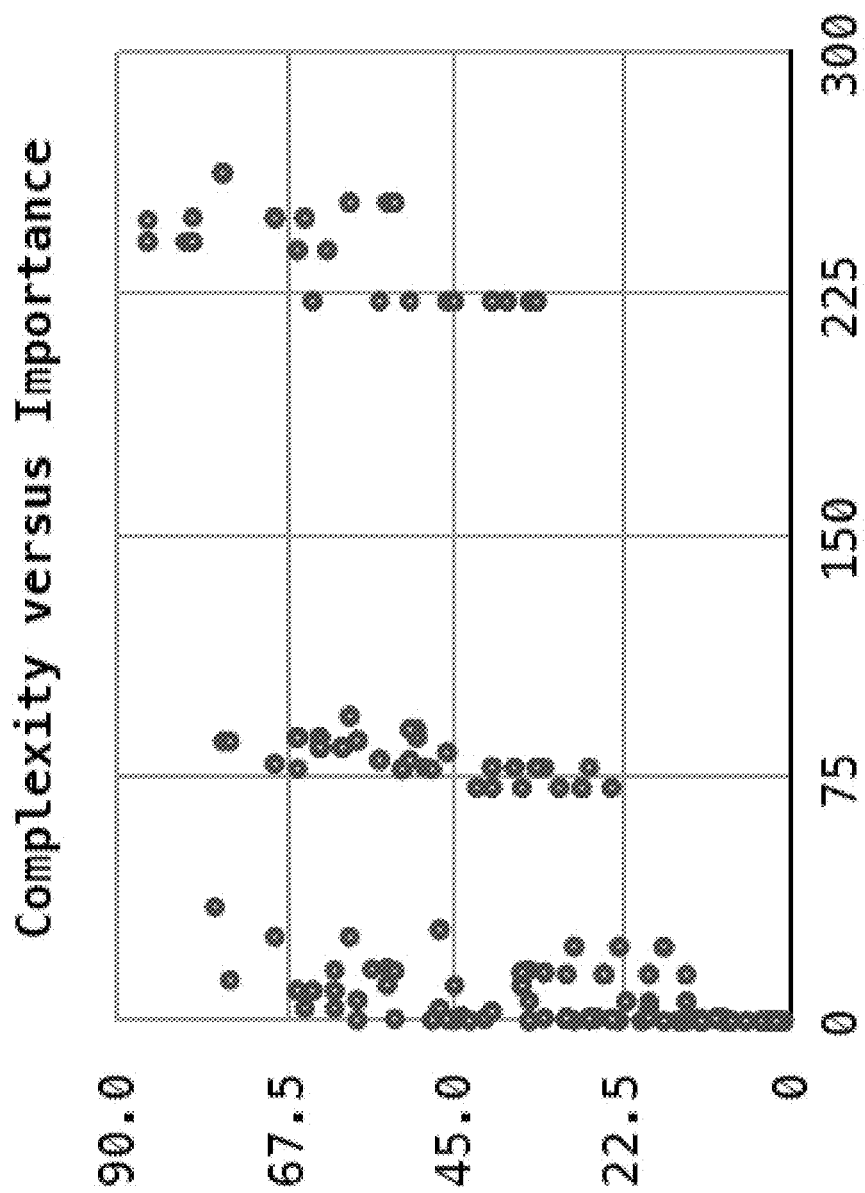
FIG. 16 is a scatter graph of assertion complexity as a function of importance.
Figure 17:
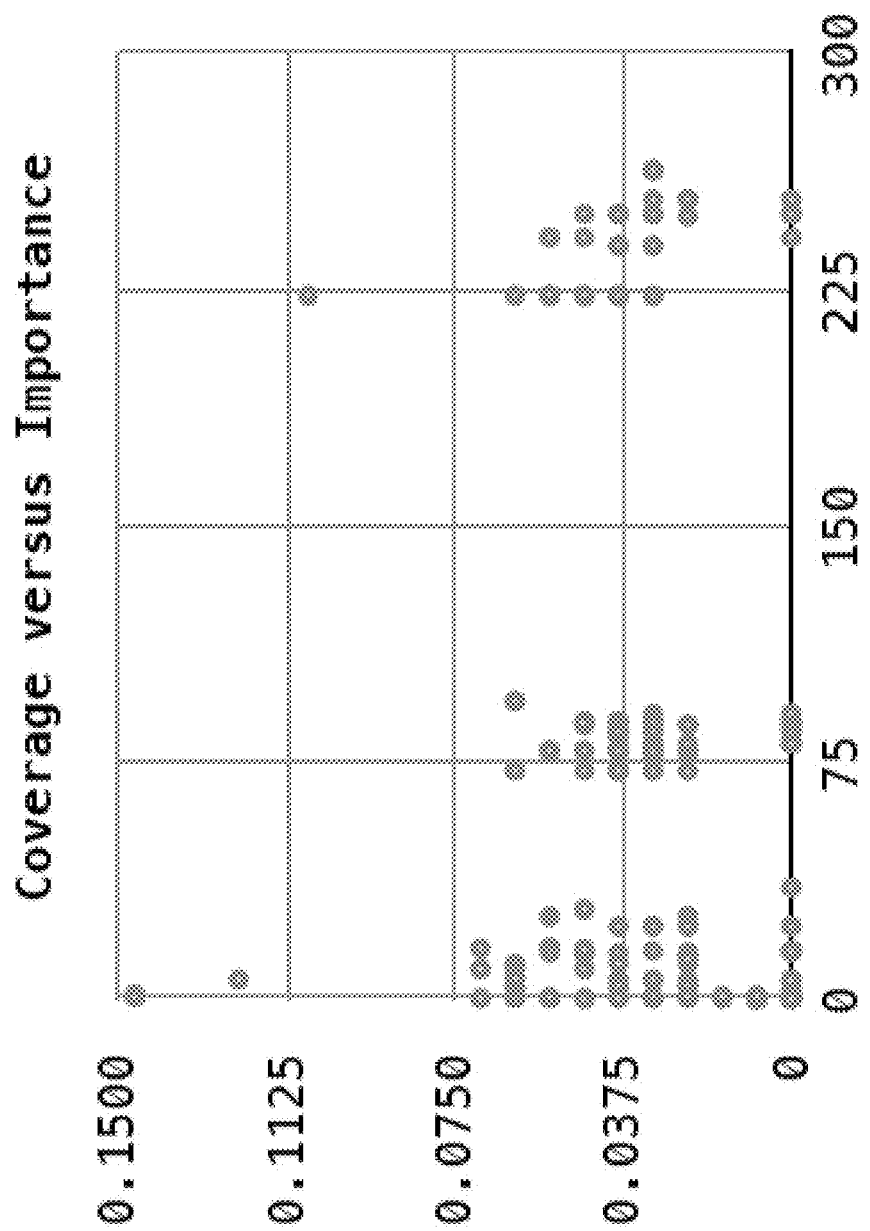
FIG. 17 is a scatter graph of assertion coverage as a function of importance.
Figure 18:
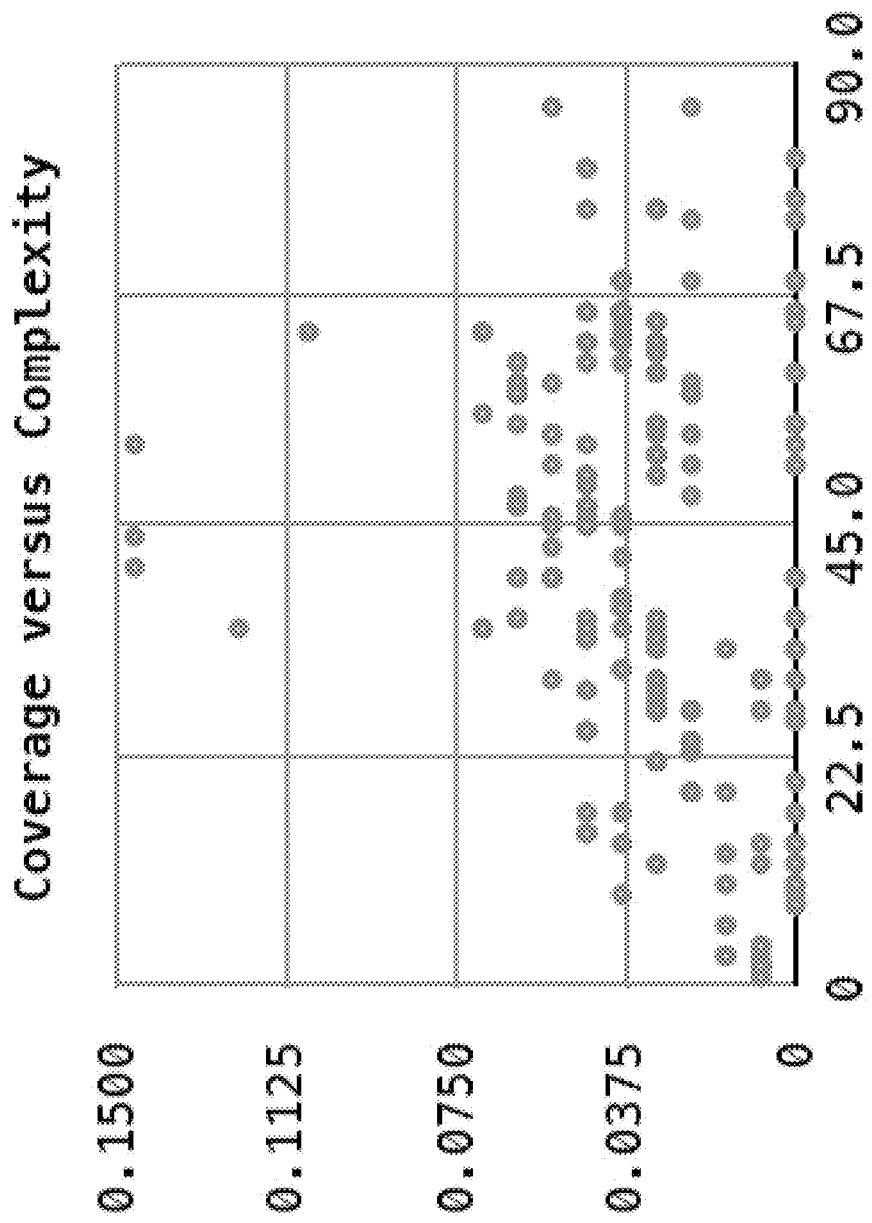
FIG. 18 is a scatter graph of assertion coverage as a function of complexity.
Figure 19:
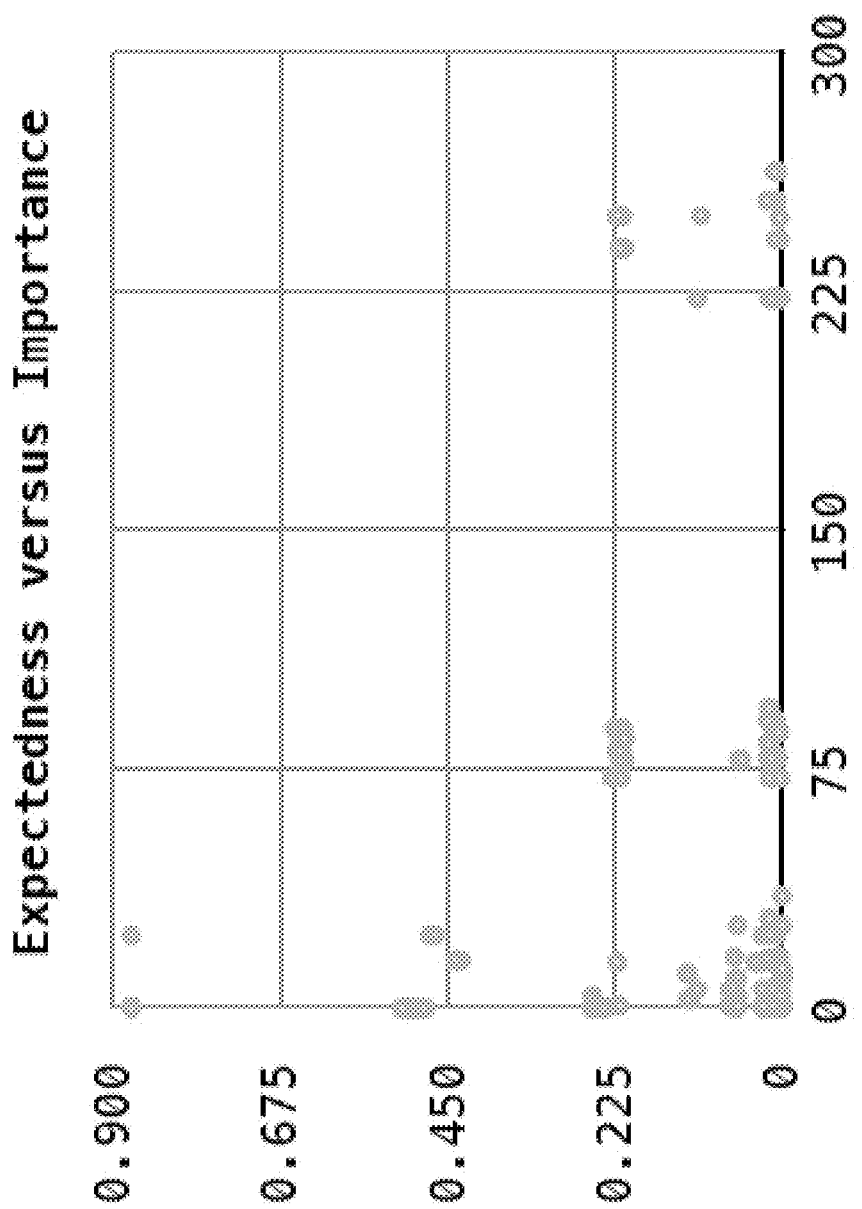
FIG. 19 is a scatter graph of assertion expectedness as a function of importance.
Figure 20:
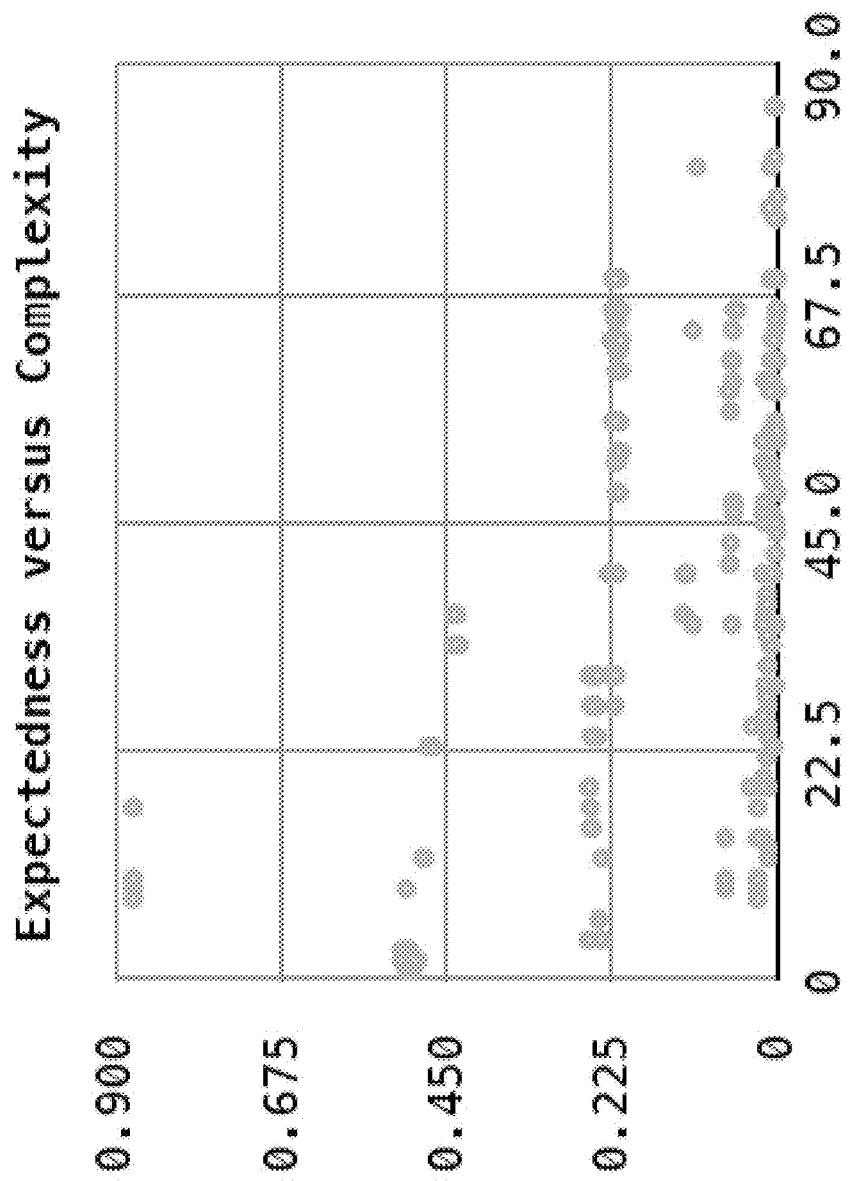
FIG. 20 is a scatter graph of assertion expectedness as a function of complexity.
Figure 21:
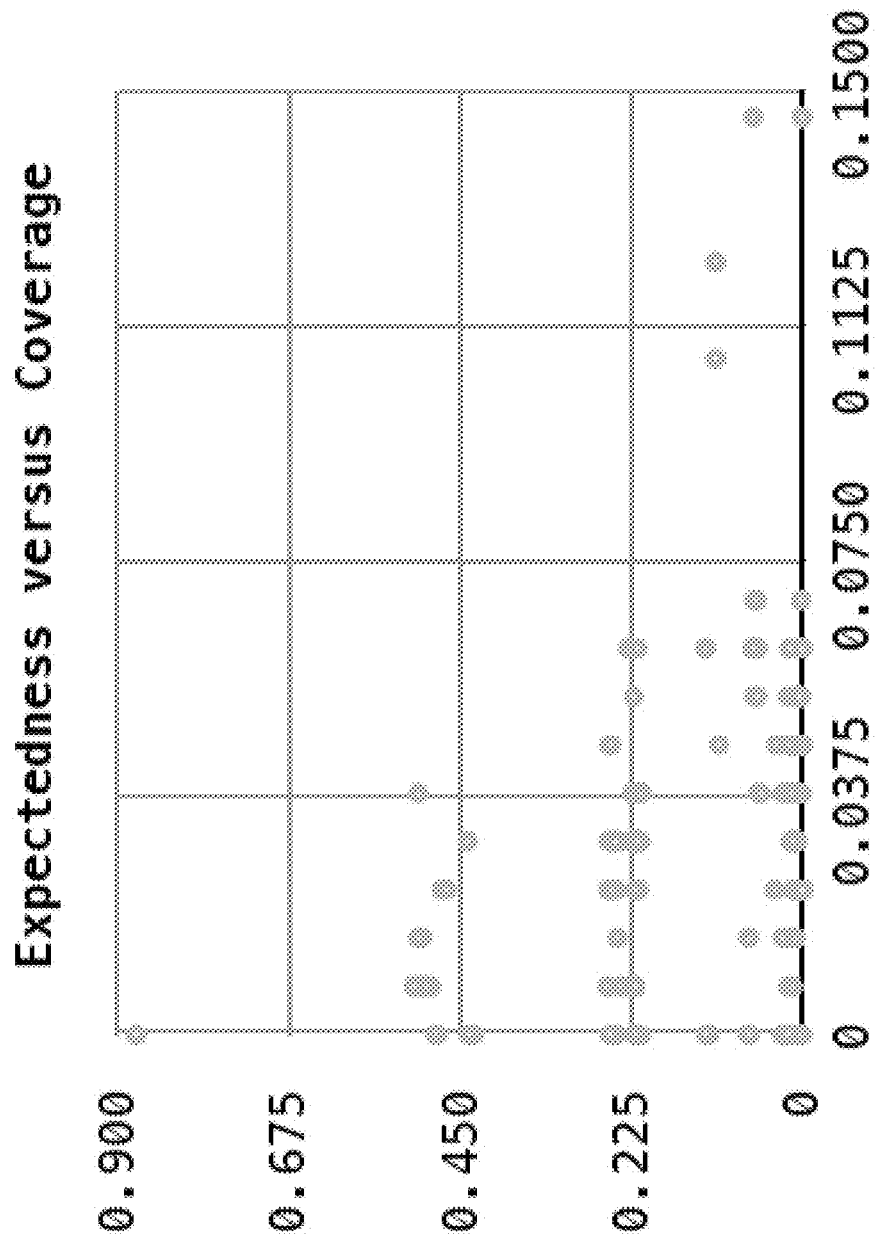
FIG. 21 is a scatter graph of assertion expectedness as a function of coverage.

FIG. 16 is a scatter graph of assertion complexity as a function of importance. FIG. 17 is a scatter graph of assertion coverage as a function of importance. FIG. 18 is a scatter graph of assertion coverage as a function of complexity. FIG. 19 is a scatter graph of assertion expectedness as a function of importance. FIG. 20 is a scatter graph of assertion expectedness as a function of complexity. FIG. 21 is a scatter graph of assertion expectedness as a function of coverage.

FIGS. 16 through 21 correlate each pair of assertion metrics. These figures show that each assertion metric weakly correlates with each other metric. Therefore, these metrics' rankings are ideal for aggregation since no ranking will credit or discredit any other.

Figure 22:
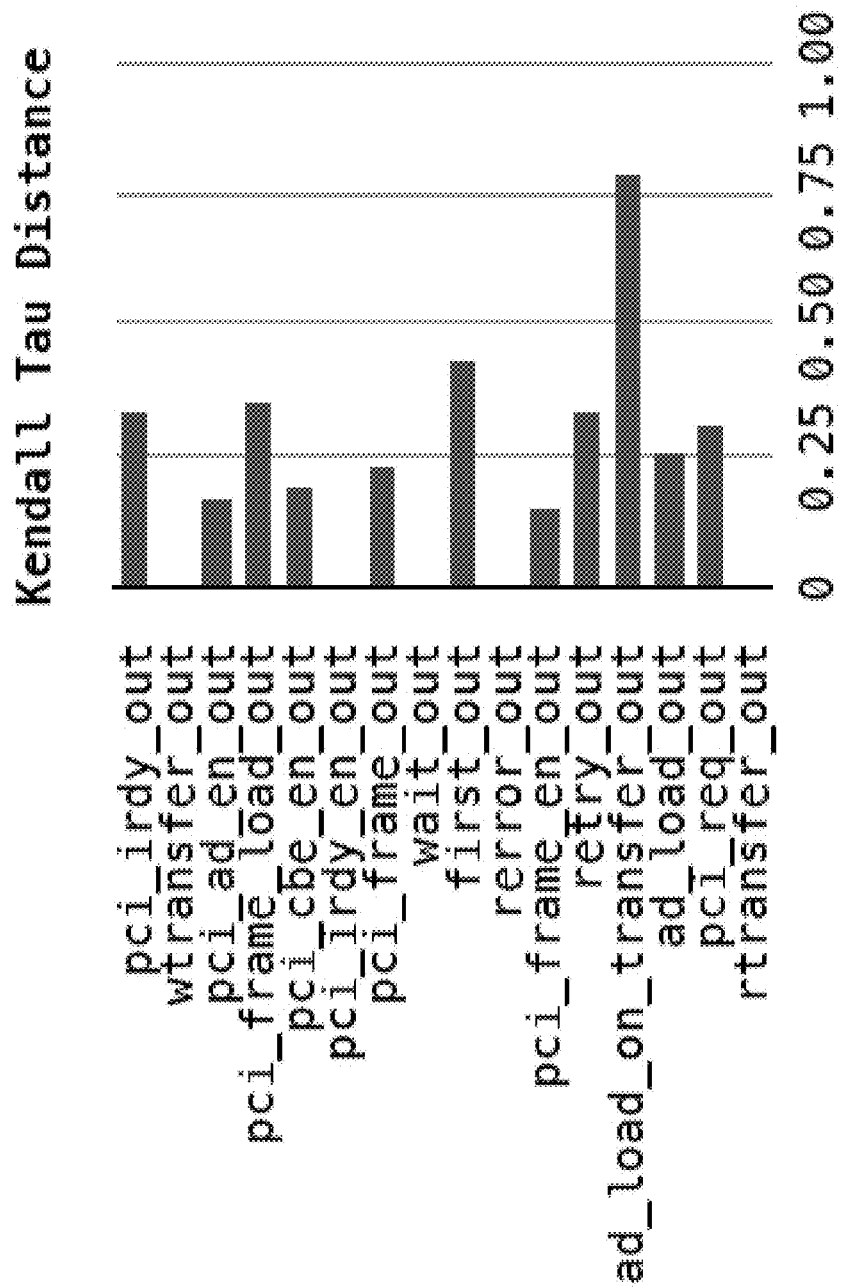
FIG. 22 is a bar graph of Kendall tau distance between a ranking for assertion rank and a rank aggregation for assertion importance and complexity.
Figure 23:
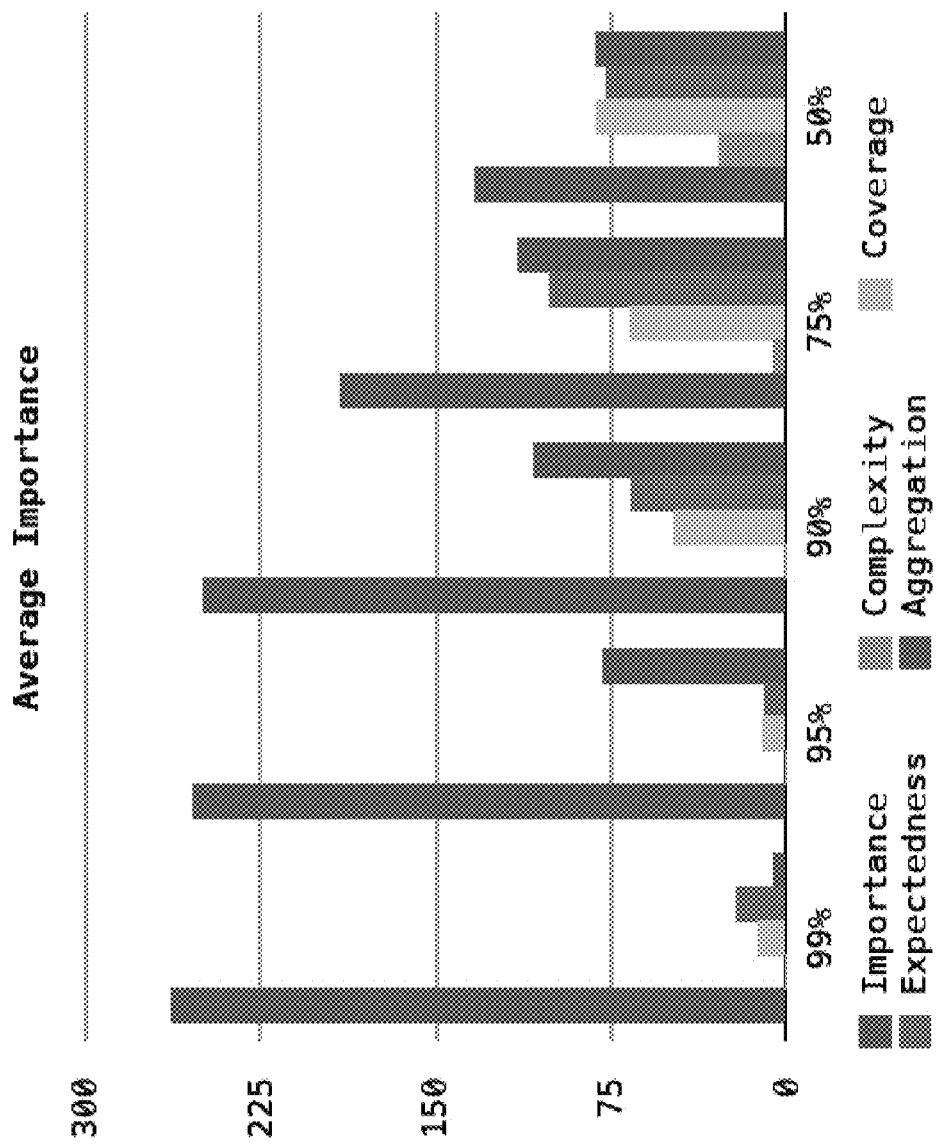
FIG. 23 is a bar graph of the average importance for assertions in the 99th, 95th, 90th, 75th, and 50th importance, complexity, coverage, expectedness and rank aggregation percentiles.
Figure 24:
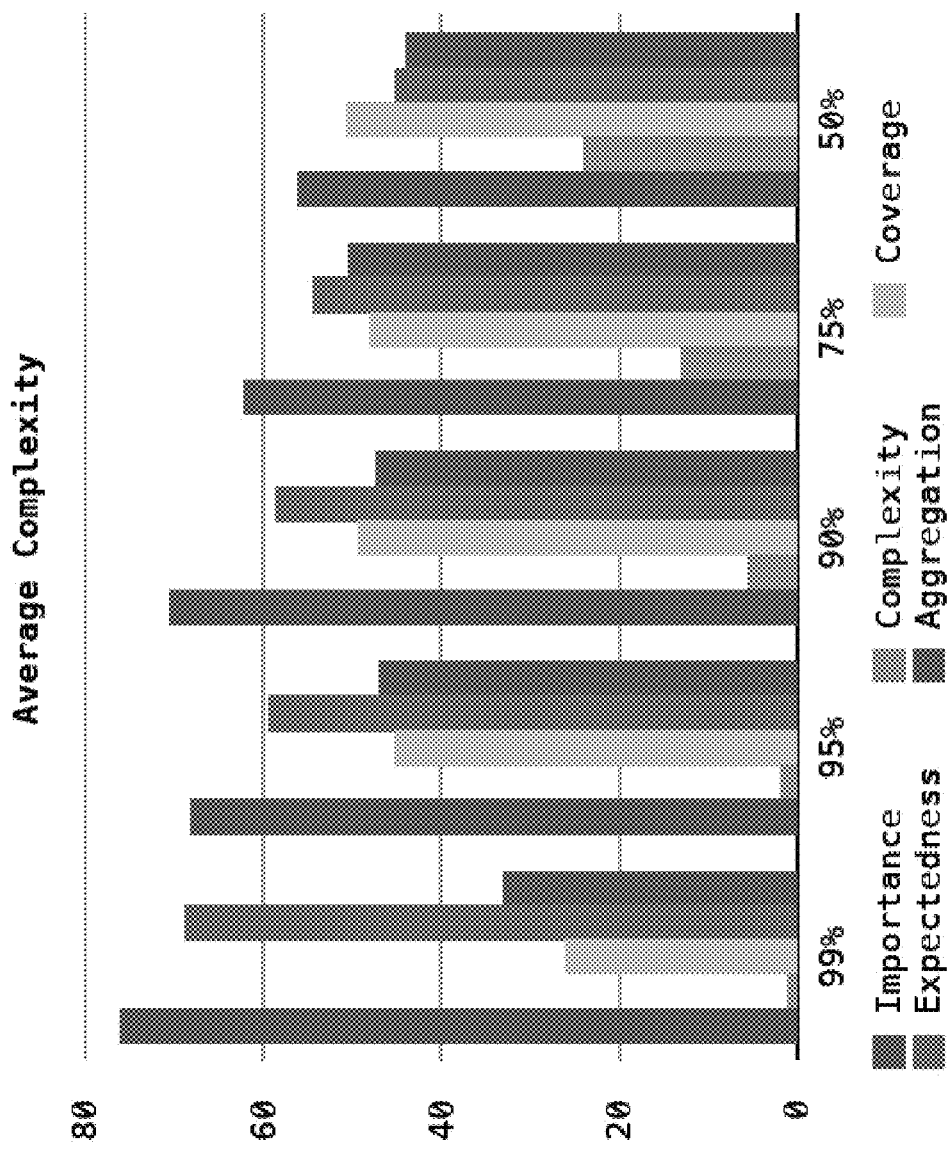
FIG. 24 is a bar graph of the average complexity for assertions in the 99th, 95th, 90th, 75th, and 50th importance, complexity, coverage, expectedness and rank aggregation percentiles.
Figure 25:
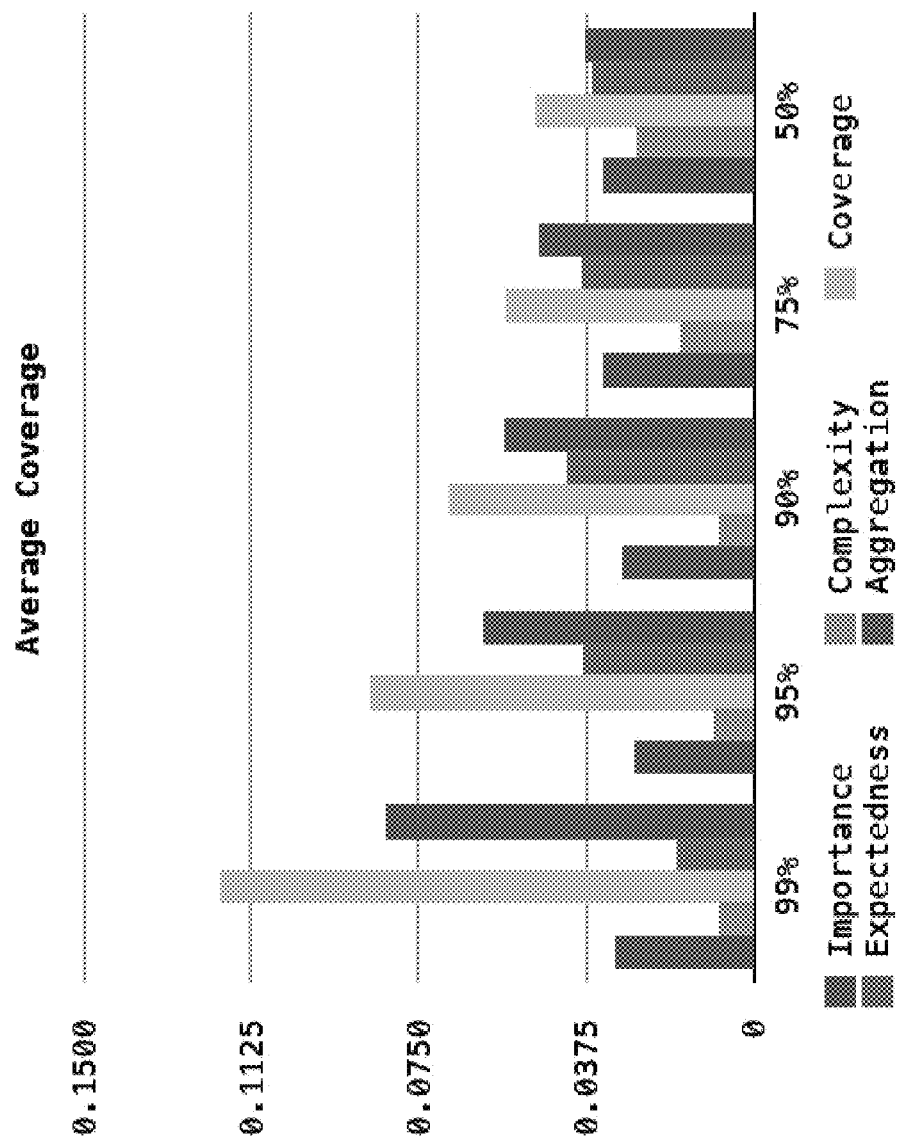
FIG. 25 is a bar graph of the average coverage for assertions in the 99th, 95th, 90th, 75th, and 50th importance, complexity, coverage, expectedness and rank aggregation percentiles.
Figure 26:
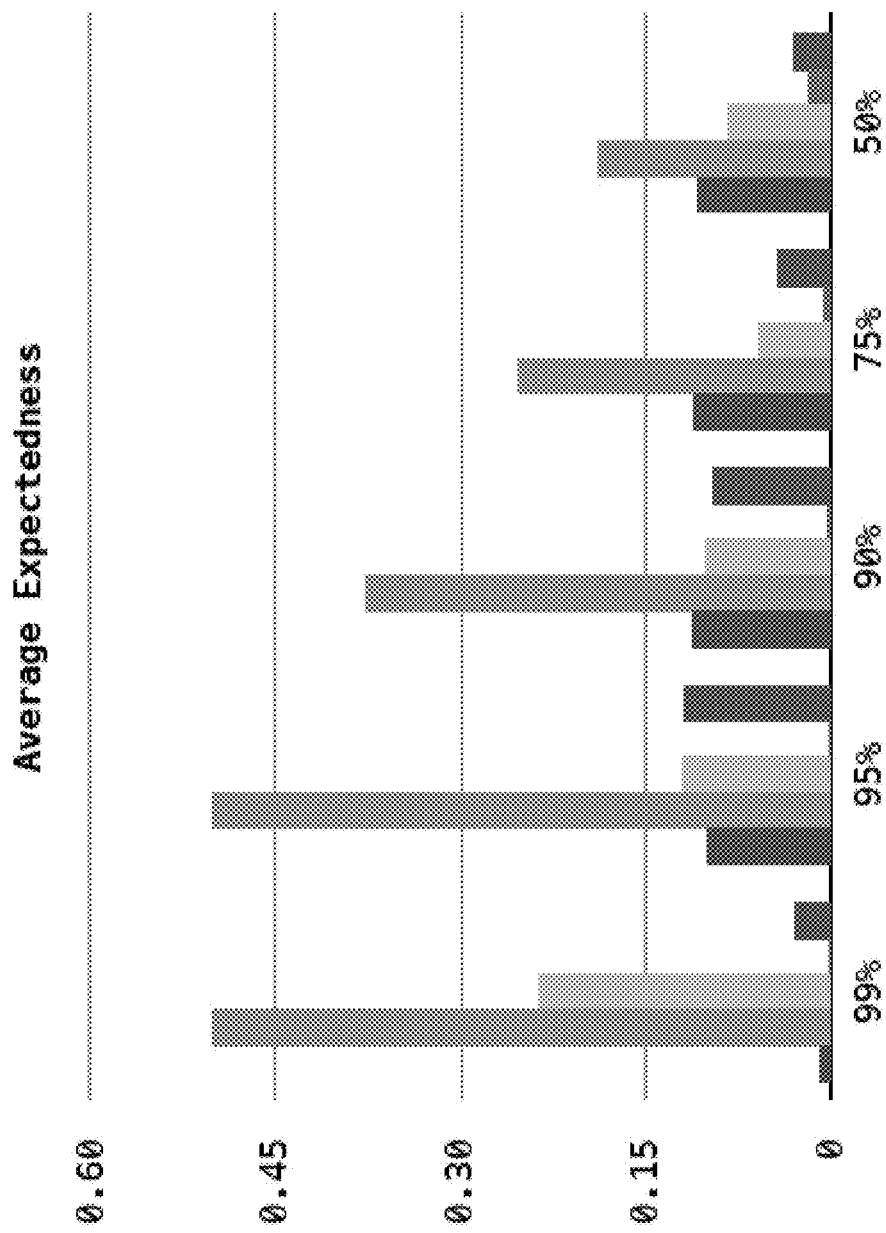
FIG. 26 is a bar graph of the average expectedness for assertions in the 99th, 95th, 90th, 75th, and 50th importance, complexity, coverage, expectedness and rank aggregation percentiles.

FIG. 22 is a bar graph of Kendall tau distance between a ranking for assertion rank and a rank aggregation for assertion importance and complexity. FIG. 22 shows the Kendall tau distance between a ranking for assertion rank and a rank aggregation for assertion importance and complexity. The figure shows that the ranking methodology presented in chapter 3 and the rank aggregation methodology are not equivalent. Therefore, the rank aggregation methodology interprets assertion importance and complexity differently than the assertion ranking methodology.

FIGS. 23 through 26 show the average importance, complexity, coverage and expectedness for assertions in the for assertions in the 99th, 95th, 90th, 75th and 50th importance, complexity, coverage, expectedness and rank aggregation percentiles. We observe the following from these figures. First, assertions that have high importance also have high complexity, moderate coverage and moderate expectedness. Second, assertions that have low complexity also have low importance, low coverage and high expectedness. Third, assertions that have high coverage also have moderate importance, high complexity and low expectedness. Fourth, assertions that have low expectedness also have moderate importance, high complexity and moderate coverage. Fifth, highly ranked assertions have high importance, low complexity, high coverage and low expectedness. Second, lowly ranked assertions never outperform highly ranked assertions with respect to any metric. Finally, the rank aggregation methodology fairly compromises between the metrics.

Figure 28:
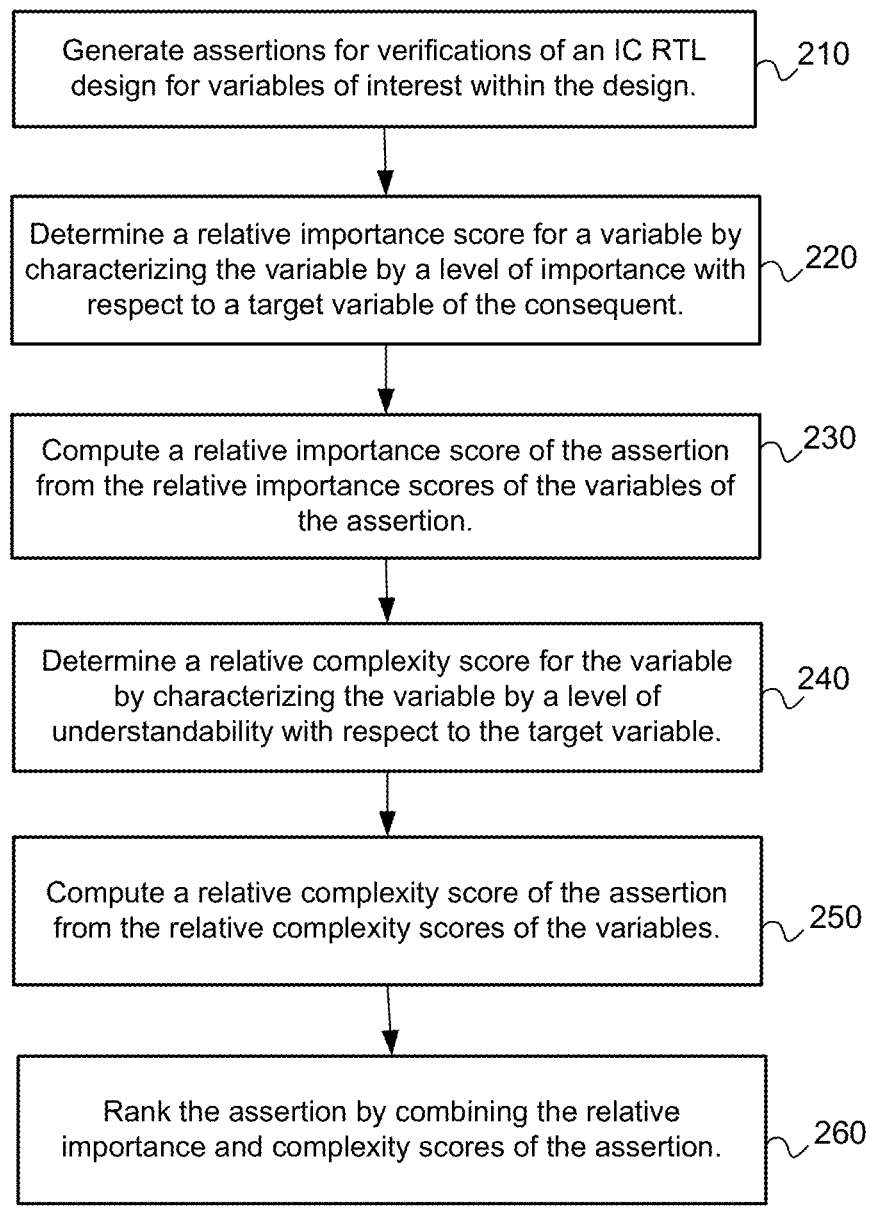
FIG. 28 is a flow chart of a method for characterizing assertions in terms of effectiveness for use in verification stimulus of an integrated circuit (IC) hardware design expressed at a register transfer level (RTL).

FIG. 28 is a flow chart of a method for characterizing assertions in terms of effectiveness for use in verification stimulus of an integrated circuit (IC) hardware design expressed at a register transfer level (RTL). The method includes generating, using a processor and memory of a computing device, assertions for verification of an integrated circuit hardware design expressed at a register transfer level (RTL) for variables of interest within the design, each assertion including variables of an antecedent related to respective target variables of a consequent (210). The computing device may further determine a relative importance score for a variable of the assertion by characterizing the variable by a level of importance with respect to a target variable of the consequent (220). The computing device may further compute a relative importance score of the assertion from the relative importance scores of the variables of the assertion (230). The computing device may further determine a relative complexity score for the variable comprising characterizing the variable by a level of understandability of the variable with respect to the target variable (240). The computing device may further compute a relative complexity score of the assertion from the relative complexity scores of the variables of the assertion (250). The computing device may further rank the assertion with respect to the RTL design for which the assertion was generated by combining the relative importance and complexity scores of the assertion, thus indicating to a designer a relative value of the assertion in performing the verification (260).

Figure 29:
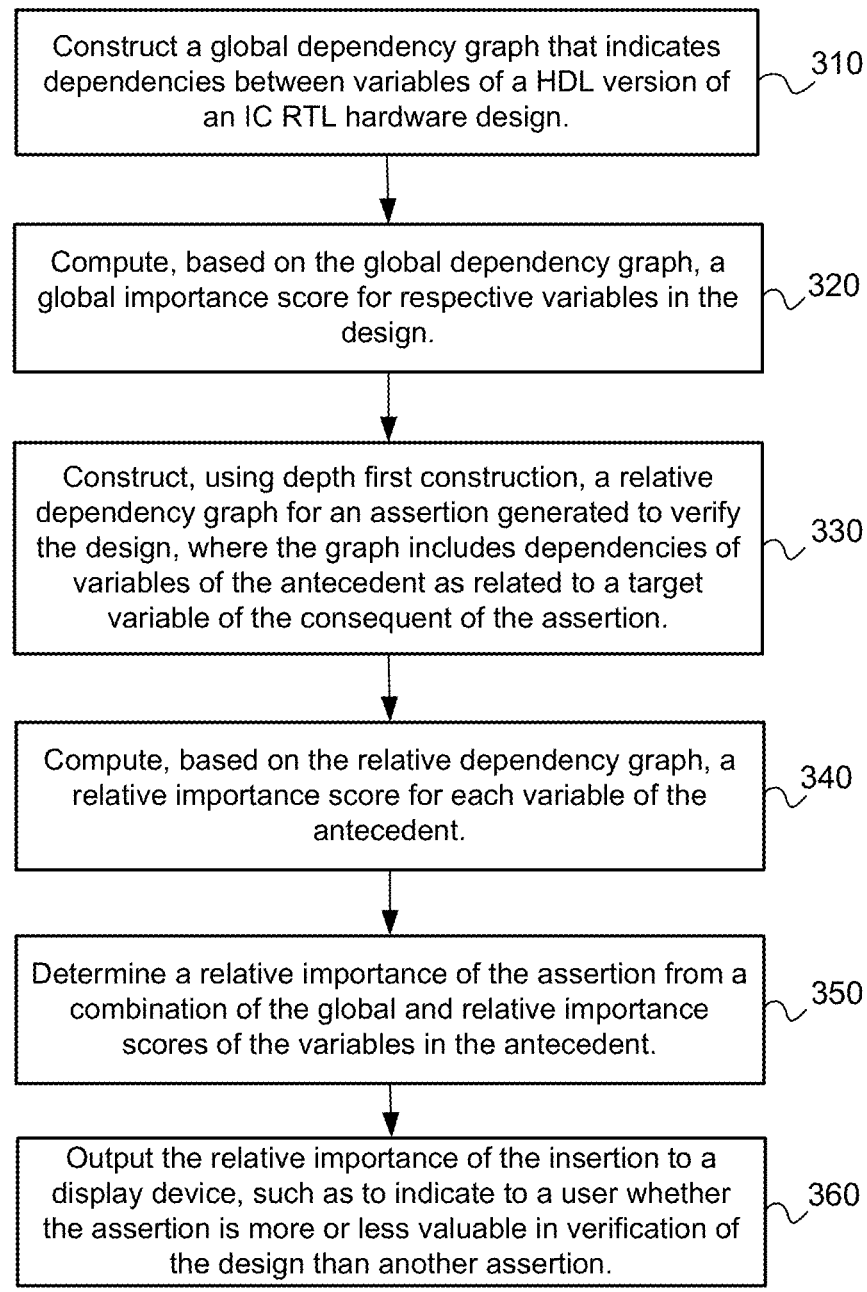
FIG. 29 is flow chart of a method for determining relative importance scores used in the characterization of the assertions referred to in FIG. 17.

FIG. 29 is flow chart of a method for determining relative importance scores used in the characterization of the assertions referred to in FIG. 17. The method may include constructing, using a processor and memory of a computing device, a global dependency graph that indicates dependencies between variables of a hardware design language (HDL) version of an integrated circuit (IC) hardware design at register transfer level (RTL) (310). The computing device may further compute, based on the global dependency graph, a global importance score for respective variables in the design (320). The computing device may further construct, using depth first construction, a relative dependency graph for an assertion generated to verify the design, the assertion including an antecedent and a consequent, where the relative dependency graph includes dependencies of variables of the antecedent as related to a target variable of the consequent (330). The computing device may further compute, based on the relative dependency graph, a relative importance score for each variable of the antecedent (340). The computing device may further determine a relative importance of the assertion from a combination of the global and relative importance scores of the variables in the antecedent (350). The computing device may further output the relative importance of the insertion to a display device, such as to indicate to a user whether the assertion is more or less valuable in verification of the design than another assertion (360).

Figure 30:
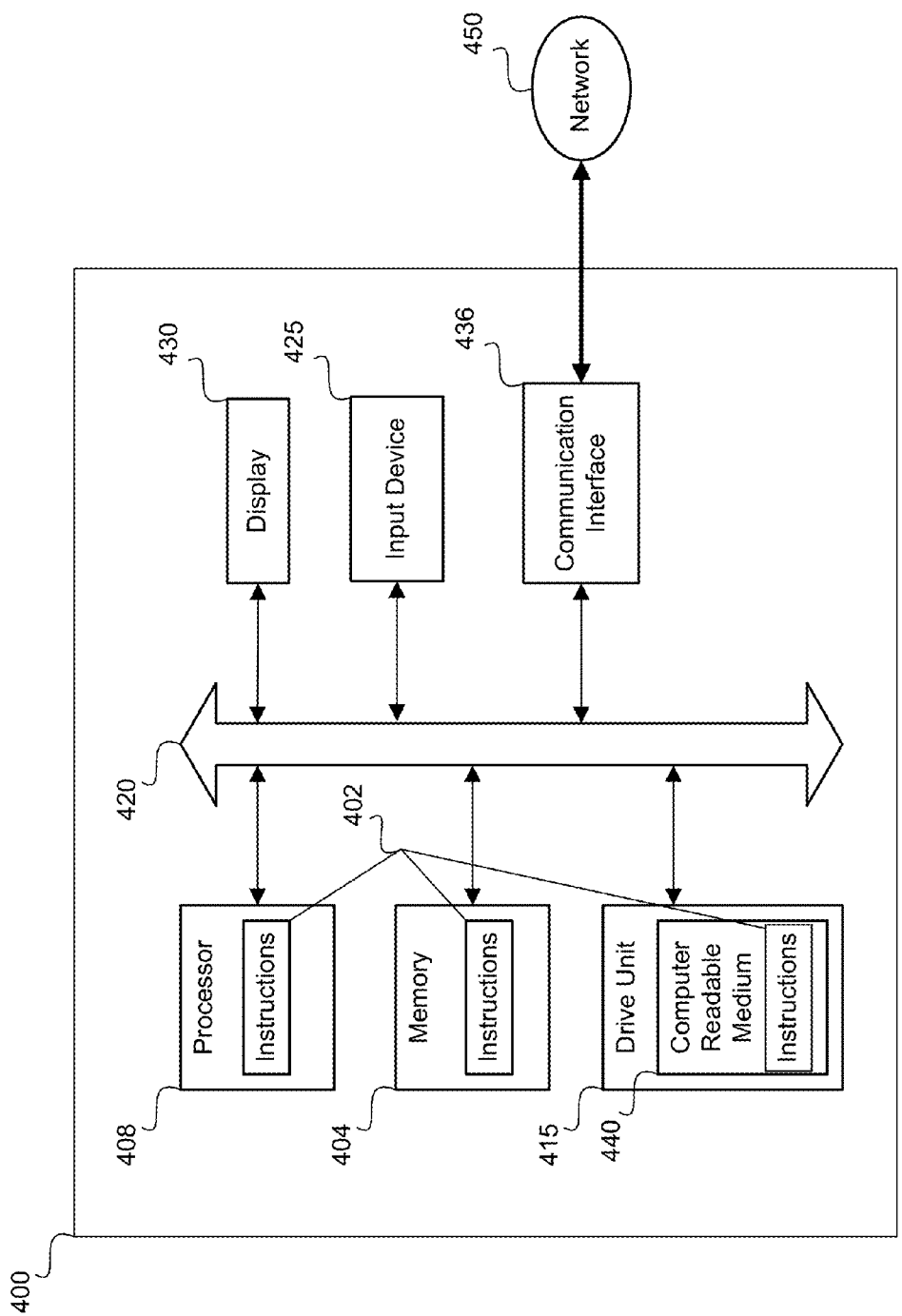
FIG. 30 illustrates a general computer system, which may represent any of the computing devices referenced herein.

FIG. 30 illustrates a general computer system 400, which may represent the system 100 disclosed with reference to FIG. 1, or any other computing devices referenced herein for execution of the disclosed methods and algorithms. The computer system 400 may include an ordered listing of a set of instructions 402 that may be executed to cause the computer system 400 to perform any one or more of the methods or computer-based functions disclosed herein. The computer system 400 may operate as a stand-alone device or may be connected to other computer systems or peripheral devices, e.g., by using a network 450.

In a networked deployment, the computer system 400 may operate in the capacity of a server or as a client-user computer in a server-client user network environment, or as a peer computer system in a peer-to-peer (or distributed) network environment. The computer system 400 may also be implemented as or incorporated into various devices, such as a personal computer or a mobile computing device capable of executing a set of instructions 402 that specify actions to be taken by that machine, including and not limited to, accessing the internet or web through any form of browser. Further, each of the systems described may include any collection of subsystems that individually or jointly execute a set, or multiple sets, of instructions to perform one or more computer functions.

The computer system 400 may include a memory 404 on a bus 420 for communicating information. Code operable to cause the computer system to perform any of the acts or operations described herein may be stored in the memory 404. The memory 404 may be a random-access memory, read-only memory, programmable memory, hard disk drive or any other type of volatile or non-volatile memory or storage device.

The computer system 400 may include a processor 408, such as a central processing unit (CPU) and/or a graphics processing unit (GPU). The processor 408 may include one or more general processors, digital signal processors, application specific integrated circuits, field programmable gate arrays, digital circuits, optical circuits, analog circuits, combinations thereof, or other now known or later-developed devices for analyzing and processing data. The processor 408 may implement the set of instructions 402 or other software program, such as manually-programmed or computer-generated code for implementing logical functions. The logical function or any system element described may, among other functions, process and/or convert an analog data source such as an analog electrical, audio, or video signal, or a combination thereof, to a digital data source for audio-visual purposes or other digital processing purposes such as for compatibility for computer processing.

The computer system 400 may also include a disk or optical drive unit 415. The disk drive unit 415 may include a computer-readable medium 440 in which one or more sets of instructions 402, e.g., software, can be embedded. Further, the instructions 402 may perform one or more of the operations as described herein. The instructions 402 may reside completely, or at least partially, within the memory 404 and/or within the processor 408 during execution by the computer system 400. Accordingly, databases configured to store data generated from execution of the disclosed methods and algorithms may be stored in the memory 404 and/or the disk unit 415.

The memory 404 and the processor 408 also may include computer-readable media as discussed above. A "computer-readable medium," "computer-readable storage medium," "machine readable medium," "propagated-signal medium," and/or "signal-bearing medium" may include any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium.

Additionally, the computer system 400 may include an input device 425, such as a keyboard or mouse, configured for a user to interact with any of the components of system 400. It may further include a display 430, such as a liquid crystal display (LCD), a cathode ray tube (CRT), or any other display suitable for conveying information. The display 430 may act as an interface for the user to see the functioning of the processor 408, or specifically as an interface with the software stored in the memory 404 or the drive unit 415.

The computer system 400 may include a communication interface 436 that enables communications via the communications network 450. The network 450 may include wired networks, wireless networks, or combinations thereof. The communication interface 436 network may enable communications via any number of communication standards, such as 802.11, 802.17, 802.20, WiMax, cellular telephone standards, or other communication standards.

Accordingly, the method and system may be realized in hardware, software, or a combination of hardware and software. The method and system may be realized in a centralized fashion in at least one computer system or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein. Such a programmed computer may be considered a special-purpose computer.

The method and system may also be embedded in a computer program product, which includes all the features enabling the implementation of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents.

The invention claimed is:

1. A method comprising:
generating, using a processor and memory of a computing device, assertions for verification of an integrated circuit hardware design expressed at a register transfer level (RTL) for variables of interest within the design, each assertion including variables of an antecedent related to respective target variables of a consequent;
determining, using the processor and for an assertion, a relative importance score for a variable comprising characterizing the variable by a level of importance with respect to a target variable of the consequent;

computing, using the processor, a relative importance score from the assertion from the relative importance scores of the variables of the assertion;

determining, using the processor, a relative complexity score for the variable comprising characterizing the variable by a level of understandability of the variable with respect to the target variable;

computing, using the processor, a relative complexity score of the assertion from the relative complexity scores of the variables of the assertion; and ranking, using the processor, the assertion with respect to the RTL design for which the assertion was generated by combining the relative importance and complexity scores of the assertion, thus indicating to a designer a relative value of the assertion in performing the verification.

2. The method of claim 1, where determining the relative importance score of the variable comprises measuring the importance of the variable with respect to spatial distance, temporal distance and of execution paths between references to the variable and assignments to the target variable, including:

increasing the relative importance score for larger numbers of assignments between the variable and the target variable;

increasing the relative importance score for a larger temporal distance between the variable and the target variable; and increasing the relative importance score for assignments between the variable and the target variable that have higher global importance scores.

3. The method of claim 1, where determining the relative complexity score of the variable comprises measuring the complexity of the variable with respect to spatial distance, temporal distance and understandability of execution paths between references to the variable and assignments to the target variable, including:

increasing the relative complexity score for larger numbers of assignments between the variable and the target variable;

increasing the relative complexity score for a larger temporal distance between the variable and the target variable; and increasing the relative complexity score more the larger a size of expression of the assertion.

4. The method of claim 1, where the ranking further includes computing a rank score for the assertion as the relative importance score of the assertion divided by the relative complexity score of the assertion, further comprising:

computing an ideality score for the assertion by normalizing the rank score with respect to a maximum rank score, the ideality score indicating a completeness of the assertion.

5. The method of claim 1, where determining the relative importance score for respective variables further includes:

incorporating into the relative importance score an importance of a statement executed between evaluation of a respective variable and assignment of the target variable, each statement including one or more variables to which an assertion refers.

6. The method of claim 1, further comprising the processor:

generating a relative dependency graph that expresses Verilog dependencies for an identified variable (v) on which the target variable depends and within a bounded number of cycles ($k_{max}$), the relative dependency graph being constructed from a global dependency graph containing dependencies between all variables in a Verilog design; and executing an algorithm on the relative dependency graph to determine the relative importance scores.

7. The method of claim 6, where generating the relative dependency graph further comprises:

(i) adding a new node and edge for each variable ($v_i$) on which the identified variable v depends;

(ii) determining a global importance score of respective variables ($v_i$) from the global dependency graph; and (iii) calculating the relative importance score ($i_r$) by summing the global importance score of $v_i$ with respective relative importance score of the identified variable, v.

8. The method of claim 7, where when the target variable ($v_t$) is a sequential variable, the method further comprising:

generating a relative importance score for each of multiple temporally dependent variables ($v^k$) within the bounded number of cycles, comprising:

recursively executing (i) through (iii) for each variable ($v_i$) on which the identified variable v depends, increasing k for each cycle until reaching $k_{max}$.

9. The method of claim 1, further comprising the processor ranking a plurality of assertions comprising:

generating a rank score for respective assertions, each including a combination of: (1) the relative importance score of the assertion; (2) the relative complexity score of the assertion; (3) a coverage of an execution path of assignments made by the assertion; and (4) expectedness; and generating an optimal assertion rank aggregation of the rank scores of the plurality of assertions by executing a footrule aggregation algorithm on the rank scores.

10. A computing system comprising:

a processor and memory of a computing device, configured to:

generate assertions for verification of an integrated circuit hardware design expressed at a register transfer level (RTL) for variables of interest within the design, each assertion including variables of an antecedent related to respective target variables of a consequent;

determine a relative importance score for a variable by characterizing the variable by a level of importance with respect to a target variable of the consequent;

compute a relative importance score of the assertion from the relative importance scores of the variables of the assertion;

determine a relative complexity score for the variable by characterizing the variable according to a level of understandability of the variable with respect to the target variable;

compute a relative complexity score of the assertion from the relative complexity scores of the variables of the assertion; and rank the assertion with respect to RTL design for which the assertion was generated by combining the relative importance and complexity scores of the assertion, thus indicating to a designer a relative value of the assertion in performing the verification.

11. The system of claim 10, where to determine the relative importance score of the variable, the processor is further configured to measure the importance of the variable with respect to spatial distance, temporal distance and of execution paths between references to the variable and assignments to the target variable, including:
  increasing the relative importance score for larger numbers of assignments between the variable and the target variable;
  increasing the relative importance score for a larger temporal distance between the variable and the target variable; and
  increasing the relative importance score for assignments between the variable and the target variable that have higher global importance scores.

12. The system of claim 10, where to determine the relative complexity score of the variable, the processor is further configured to measure the complexity of the variable with respect to spatial distance, temporal distance and understandability of execution paths between references to the variable and assignments to the target variable, including:
  increasing the relative complexity score for larger numbers of assignments between the variable and the target variable;
  increasing the relative complexity score for a larger temporal distance between the variable and the target variable; and
  increasing the relative complexity score more the larger a size of expression of the assertion.

13. The system of claim 10, where to rank the assertion, the processor is configured to compute a rank score for the assertion as the relative importance score of the assertion divided by the relative complexity score of the assertion; and where the processor is further configured to:
  compute an ideality score for the assertion by normalizing the rank score with respect to a maximum rank score, the ideality score indicating a completeness of the assertion.

14. The system of claim 10, where the processor is further is configured to:
  generate a relative dependency graph that expresses Verilog dependencies for an identified variable (v) on which the target variable depends and within a bounded number of cycles ($k_{max}$), the relative dependency graph being constructed from a global dependency graph containing dependencies between all variables in a Verilog design; and
  execute an algorithm on the relative dependency graph to determine the relative importance scores.

15. The system of claim 14, where to generate the relative dependency graph, the processor is further configured to:
  (i) add a new node and edge for each variable ($v_i$) on which the identified variable v depends;
  (ii) determine a global importance score of respective variables ($v_i$) from the global dependency graph; and
  (iii) calculate the relative importance score ($i_r$) by summing the global importance score of $v_i$ with respective relative importance score of the identified variable, v.

16. The system of claim 15, where when the target variable ($v_t$) is a sequential variable, and the processor is further configured to:
  generate a relative importance score for each of multiple temporally dependent variables ($v^k$) within the bounded number of cycles, comprising: recursively executing (i) through (iii) for each variable ($v_i$) on which the identified variable v depends, increasing k for each cycle until reaching $k_{max}$.

17. The system of claim 10, where the processor is further configured to rank a plurality of assertions by:
  generating a rank score for respective assertions, each including a combination of: (1) the relative importance score of the assertion; (2) the relative complexity score of the assertion; (3) a coverage of an execution path of assignments made by the assertion; and (4) expectedness; and
  generating an optimal assertion rank aggregation of the rank scores of the plurality of assertions by executing a footrule aggregation algorithm on the rank scores.

18. A method comprising:
  generating, using a processor and memory of a computing device, a plurality of assertions for verification of an integrated circuit hardware design expressed at a register transfer level (RTL) for variables of interest within the design, each assertion including variables of an antecedent related to respective target variables of a consequent;
  computing, using the processor and for respective assertions, a relative importance score of an assertion, a relative complexity score of the assertion, coverage of an execution path of assignments made by the assertion, and expectedness of the assertion;
  generating, using the processor and for respective assertions, a rank score for each assertion as an aggregate of the relative importance score, the relative complexity score, the coverage and the expectedness of the assertion;
  outputting, using the processor and to a display device of the computing device, a ranked list of the assertions according to rank score so as to indicate relative value of the plurality of assertions in performing the verification;
  where computing the relative importance score comprises:
  characterizing each variable of the assertion by a level of importance with respect to a target variable of a consequent of the assertion; and
  aggregating the relative importance scores of the variables of the assertion; and
  where computing the relative complexity score comprises:
  characterizing each variable of the assertion by a level of understandability of the variables with respect to the target variable; and
  aggregating the relative complexity scores of the variables of the assertion.

19. The method of claim 18, further comprising:
  generating an optimal assertion rank aggregation of the rank scores of the plurality of assertions by executing a footrule aggregation algorithm on the rank scores.

* * * * *